US012669906B2

(12) United States Patent
Li et al.

(10) Patent No.: US 12,669,906 B2
(45) Date of Patent: Jun. 30, 2026

(54) DISPLAY PANEL AND DISPLAY DEVICE

(71) Applicant: XIAMEN TIANMA DISPLAY TECHNOLOGY CO., LTD., Xiamen (CN)

(72) Inventors: Wenzhi Li, Xiamen (CN); Huangyao Wu, Xiamen (CN)

(73) Assignee: XIAMEN TIANMA DISPLAY TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 18/915,362

(22) Filed: Oct. 15, 2024

(65) Prior Publication Data

US 2025/0036247 A1     Jan. 30, 2025

(30) Foreign Application Priority Data

Oct. 18, 2023     (CN) .......................... 202311350934.3

(51) Int. Cl.
| | |
|---|---|
| *G06F 3/044* | (2006.01) |
| *H10K 59/40* | (2023.01) |
| *H10K 59/80* | (2023.01) |

(52) U.S. Cl.
CPC .......... G06F 3/0446 (2019.05); G06F 3/0443 (2019.05); H10K 59/40 (2023.02); H10K 59/8792 (2023.02)

(58) Field of Classification Search
CPC ...... G06F 3/0446; G06F 3/0443; G06F 3/041; G06F 3/0412; G06F 2203/04111; G06F 2203/04112; G06F 3/0445; H10K 59/40; H10K 59/8792
See application file for complete search history.

(56) References Cited

U.S. PATENT DOCUMENTS

| | | | |
|---|---|---|---|
| 2013/0021289 A1* | 1/2013 | Chen ................... | H10K 50/8426 345/174 |
| 2013/0147730 A1* | 6/2013 | Chien ................... | G06F 3/0446 345/173 |
| 2014/0168138 A1* | 6/2014 | Kuo ...................... | G06F 3/0446 345/174 |
| 2017/0364175 A1* | 12/2017 | Park ...................... | G06F 3/0445 |
| 2018/0239472 A1* | 8/2018 | Park ...................... | B60R 11/04 |
| 2019/0243496 A1* | 8/2019 | Lee ...................... | G06F 3/0412 |
| 2019/0258338 A1* | 8/2019 | Park ...................... | G06F 3/0412 |
| 2020/0026375 A1* | 1/2020 | Park ...................... | G06F 3/0448 |
| 2021/0373708 A1* | 12/2021 | Kim ...................... | G06F 3/0412 |
| 2022/0155904 A1* | 5/2022 | Jang ...................... | G06F 3/0446 |
| 2024/0329784 A1* | 10/2024 | Han ...................... | G06F 3/0412 |

* cited by examiner

*Primary Examiner* — Md Saiful A Siddiqui
(74) *Attorney, Agent, or Firm* — KILPATRICK TOWNSEND & STOCKTON LLP

(57)     ABSTRACT

A display panel and a display device. The display panel includes a display layer and a touch layer. A touch electrode in the touch layer includes metal frames. An orthographic projection of the metal frame on the display panel is located at a periphery of an orthographic projection of a pixel opening on the display panel. The metal frame includes a first metal frame. Light-emitting elements are configured to emit light with a first color. The first metal frame includes a first bar and a second bar in a first direction. A fracture is located between adjacent touch electrodes and includes a first fracture. One first fracture is located in the first bar of a first metal frame, and another first fracture is located in the first bar or the second bar of another first metal frame. The first direction is parallel to the display panel.

17 Claims, 16 Drawing Sheets

200

100

DISPLAY PANEL AND DISPLAY DEVICE

This application claims priority to Chinese Patent Application No. 202311350934.3, titled "DISPLAY PANEL AND DISPLAY DEVICE", filed on Oct. 18, 2023 with the China National Intellectual Property Administration, which is incorporated herein by reference in its entirety.

FIELD

The present disclosure relates to the field of display technology, and in particular to a display panel and a display device.

BACKGROUND

As an input medium, the touch screen is currently the most simple, convenient and apparent human-computer interaction means. With the development of the display technology, increasing display panels are integrated with a touch function.

Touch screen technology refers to a technology in which when a finger, a pen, and the like touches a touch screen installed in the front of a display device, a touched position (in a form of coordinates) is detected and transmitted to a CPU, so as to determine inputted information. At present, the touch screens are widely applied in various products including mobile terminals and touch-screen mobile phones and laptops, human-computer display interfaces for industrial automation, and the like.

In order to achieve the touch function of the display device, a touch electrode is usually introduced into the display device. In a case that the touch electrode is implemented as a metal frame, there is a common problem of horizontal lines at a large viewing angle, which affects a display effect at a large viewing angle.

SUMMARY

In view of the above, a display panel and a display device are provided according to the present disclosure. The problem of horizontal lines at a large viewing angle can be solved, to improve the display effect.

One embodiment provides a display panel according to the present disclosure. The display panel comprises a display layer, and a touch layer arranged on a side of the display layer, where the display layer comprises multiple pixel openings and light-emitting elements corresponding to the multiple pixel openings, the multiple pixel openings comprises multiple first pixel openings, and light-emitting elements corresponding to the multiple first pixel openings are configured to emit light with a first color; the touch layer comprises multiple touch electrodes that are insulated from each other, the multiple touch electrodes comprises multiple metal frames that are electrically connected to form a grid and an orthographic projection of each metal frame of the multiple metal frames on a plane where the display panel is located is located at a periphery of an orthographic projection of each pixel opening of the multiple pixel openings on the plane where the display panel is located; the multiple metal frames comprises first metal frames, an orthographic projection of each first metal frame of the first metal frames on the plane where the display panel is located is located at the periphery of an orthographic projection of a respective first pixel opening of the multiple first pixel openings on the plane where the display panel is located, and each first metal frame comprises a first bar and a second bar that are opposite to each other in a first direction; and one or more fractures are located between at least a pair of adjacent touch electrodes among the multiple touch electrodes, the one or more fractures comprise first fractures, at least one of the first fractures is located in the first bar of a first metal frame of the first metal frames, and another at least one of the first fractures is located in the first bar or the second bar of another first metal frame of the first metal frames, where the first direction is parallel to the plane where the display panel is located.

Some embodiments provide a display device according to the present disclosure. The display device comprises the display panel. The display panel comprises a display layer, and a touch layer arranged on a side of the display layer, where the display layer comprises multiple pixel openings and light-emitting elements corresponding to the multiple pixel openings, the multiple pixel openings comprises multiple first pixel openings, and light-emitting elements corresponding to the multiple first pixel openings are configured to emit light with a first color; the touch layer comprises multiple touch electrodes that are insulated from each other, the multiple touch electrodes comprises multiple metal frames that are electrically connected to form a grid and an orthographic projection of each metal frame of the multiple metal frames on a plane where the display panel is located is located at a periphery of an orthographic projection of each pixel opening of the multiple pixel openings on the plane where the display panel is located; the multiple metal frames comprises first metal frames, an orthographic projection of each first metal frame of the first metal frames on the plane where the display panel is located is located at the periphery of an orthographic projection of a respective first pixel opening of the multiple first pixel openings on the plane where the display panel is located, and each first metal frame comprises a first bar and a second bar that are opposite to each other in a first direction; and one or more fractures are located between at least a pair of adjacent touch electrodes among the multiple touch electrodes, the one or more fractures comprise first fractures, at least one of the first fractures is located in the first bar of a first metal frame of the first metal frames, and another at least one of the first fractures is located in the first bar or the second bar of another first metal frame of the first metal frames, where the first direction is parallel to the plane where the display panel is located.

Embodiments of the present disclosure become apparent from the detailed description of the exemplary embodiments of the present disclosure with reference to the drawings.

BRIEF DESCRIPTION OF THE DRAWINGS

The drawings combined in the specification constitute a part of the specification show various embodiments of the present disclosure, and are configured to explain principles of the present disclosure together with the description thereof.

DETAILED DESCRIPTION OF EMBODIMENTS

Figure 1:
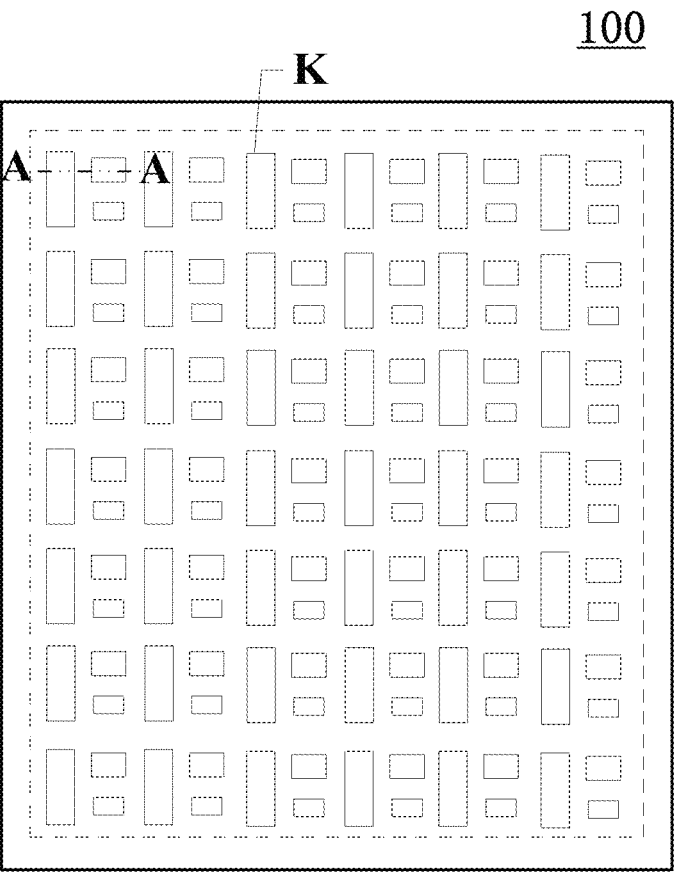
FIG. 1 is a top view of a display panel according to an embodiment of the present disclosure.

Hereinafter, exemplary embodiments of the present disclosure are described in detail with reference to the drawings. It should be noted that the relative arrangement of the components and steps, numerical expressions and numerical values set forth in the embodiments are not intended to limit the scope of the present disclosure unless otherwise specially stated.

The description of at least one of the exemplary embodiments is only illustrative rather than a limitation to the present disclosure and application or usage thereof.

Techniques, methods and apparatus known may not be discussed in detail, but where appropriate, the techniques, methods and apparatus should be considered as a part of the specification.

In all of the examples shown and discussed herein, any specific values are to be construed as illustrative only and not as a limitation. Thus, different values may be applied in other examples of the exemplary embodiments.

Various modifications and variations to the present disclosure without departing from the embodiments of the present disclosure. Therefore, the present disclosure is intended to cover modifications and variations of the present disclosure, which fall within the scope of the claims (the claimed embodiments) and their equivalents. It should be noted that the implementations provided in the embodiments of the present disclosure may be combined with each other as long as there is no conflict.

It should be noted that similar reference numerals and letters indicate similar items in the following drawings. Therefore, once an item is defined in a Figure, it is not required to be further discussed in the subsequent Figures.

Figure 2:
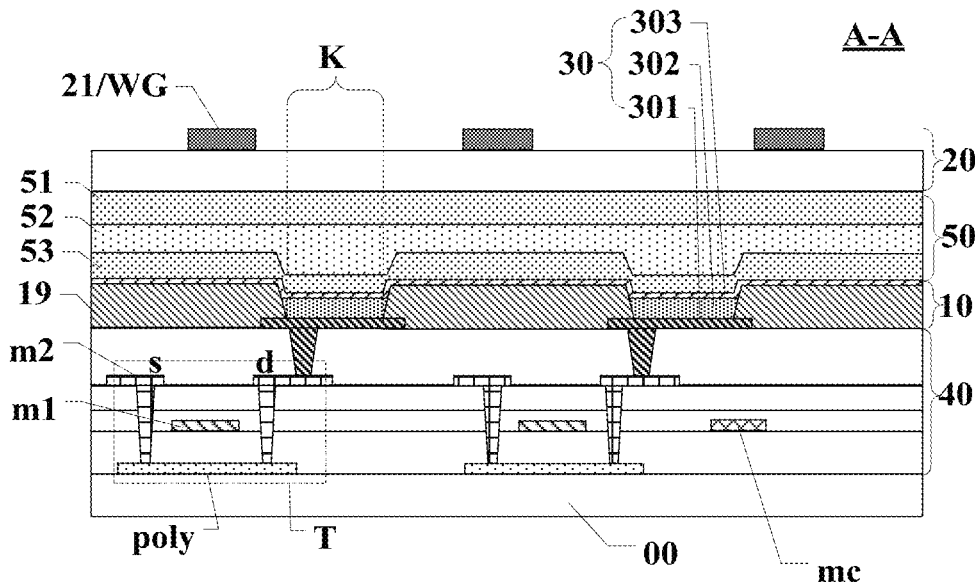
FIG. 2 is a cross section view of FIG. 1 in a direction indicated by AA.
Figure 3:
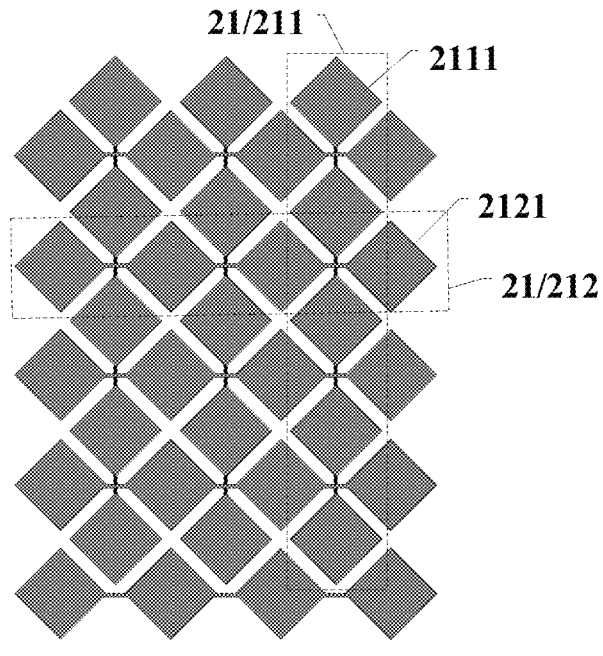
FIG. 3 is a schematic diagram showing an arrangement of touch electrodes in a touch layer.
Figure 4:
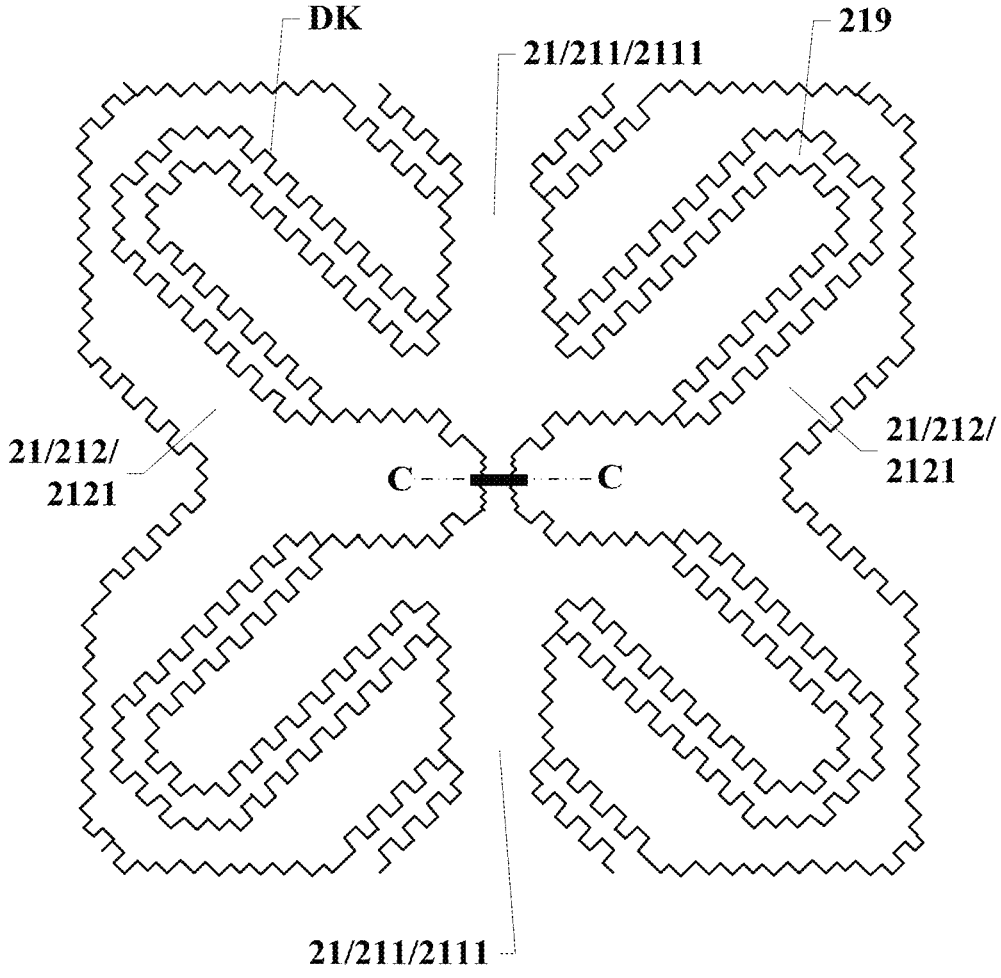
FIG. 4 is a schematic diagram showing a planar structure of a touch electrode according to an embodiment of the present disclosure.
Figure 5:
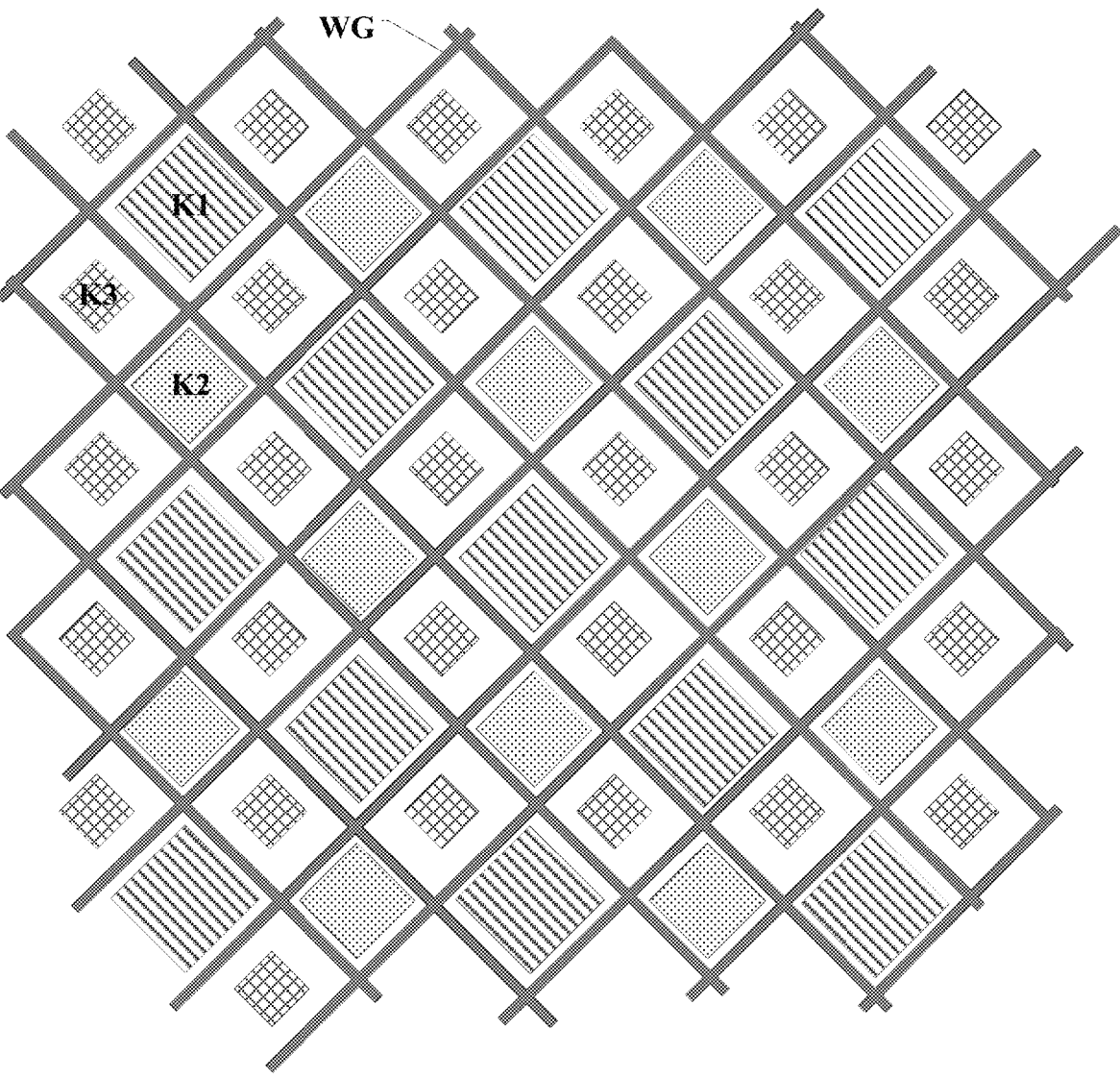
FIG. 5 is a schematic diagram showing a relative position relationship between pixel openings and metal frames of touch electrodes according to an embodiment of the present disclosure.
Figure 6:
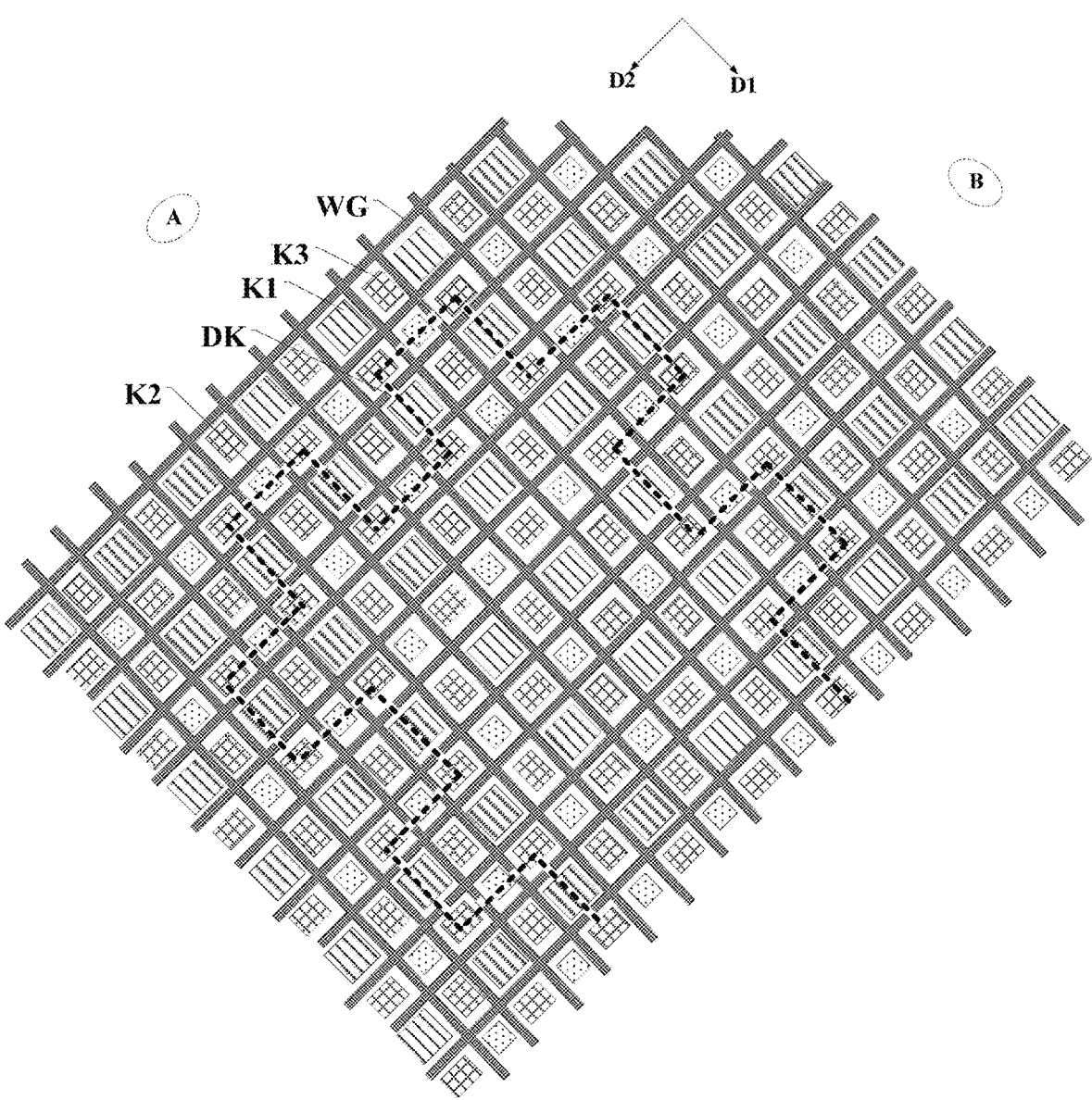
FIG. 6 is a schematic diagram showing that adjacent regions of adjacent first touch electrode and second touch electrode are insulated from each other by fractures.
Figure 7:
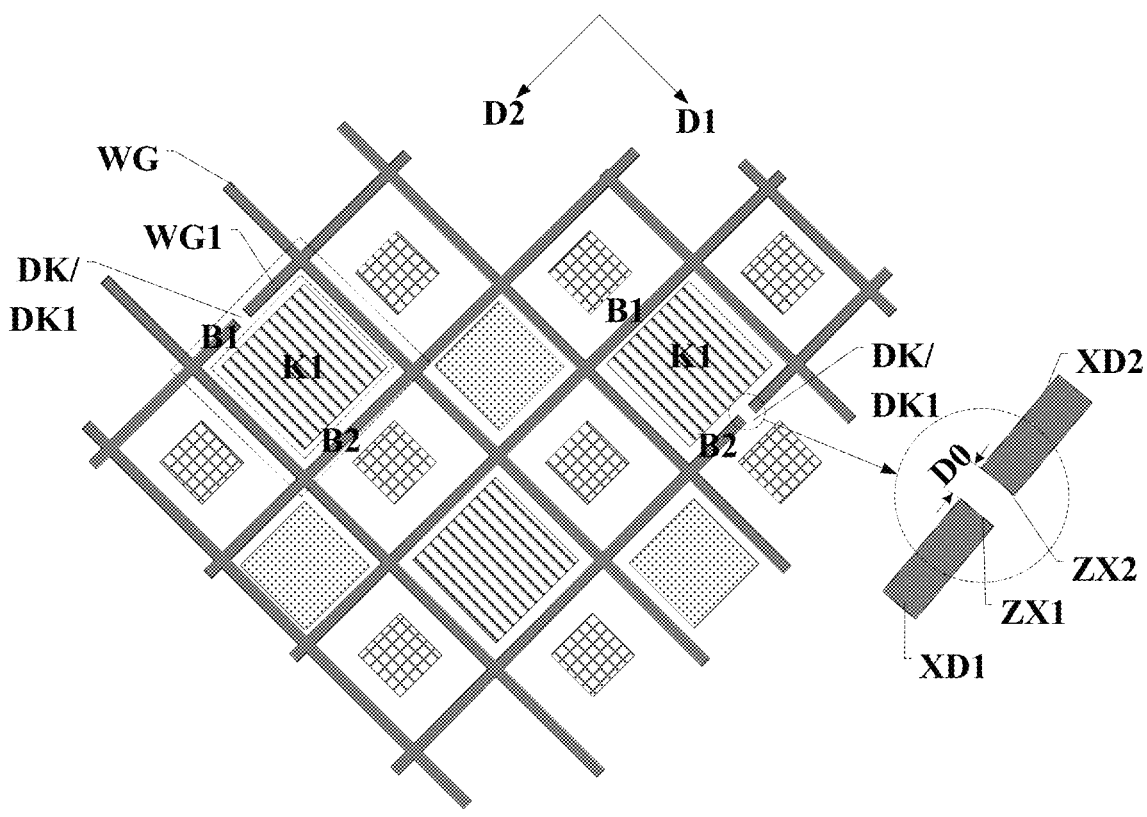
FIG. 7 is a schematic diagram showing an enlarged view of pixel openings and metal frames of touch electrodes.

FIG. 1 is a top view of a display panel according to an embodiment of the present disclosure. FIG. 2 is a cross section view of FIG. 1 in a direction indicated by AA. FIG. 3 is a schematic diagram showing an arrangement of touch electrodes 21 in a touch layer 20. FIG. 4 is a schematic diagram showing a planar structure of a touch electrode according to an embodiment of the present disclosure. FIG. 5 is a schematic diagram showing a relative position relationship between pixel openings and metal frames of the touch electrodes 21 according to an embodiment of the present disclosure. FIG. 6 is a schematic diagram showing that adjacent regions of adjacent first touch electrode and second touch electrode are insulated from each other by fractures. FIG. 7 is a schematic diagram showing an enlarged view of the pixel openings and the metal frames of the touch electrodes 21. Referring to FIG. 1 to FIG. 7, the display panel according to the embodiments of the present disclosure comprises a display layer 10, and a touch layer 20 arranged on a side of the display layer 10.

The display layer 10 comprises multiple pixel openings K and light-emitting elements 30 corresponding to the pixel openings K. The pixel openings K comprise multiple first pixel openings K1, and light-emitting colors of light-emitting elements 30 corresponding to the first pixel openings K1 are all a first color.

The touch layer 20 comprises multiple touch electrodes 21 that are insulated from each other. The touch electrodes 21 comprise multiple metal frames that are electrically connected. An orthographic projection of the metal frame on a plane where the display panel is located is at a periphery of an orthographic projection of the pixel opening on the display panel.

The metal frame comprises a first metal frame WG1. An orthographic projection of the first metal frame WG1 on the display panel corresponds to an orthographic projection of the first pixel opening on the display panel. The first metal frame WG1 comprises a first bar B1 and a second bar B2 that are opposite to each other in a first direction.

A fracture DK is provided between at least some of adjacent touch electrodes 21. The fracture DK comprises first fractures DK1. At least one first fracture DK1 is located on the first bar B1 of a first metal frame WG1, and at least one first fracture DK1 is located on the first bar B1 or the second bar B2 of another first metal frame WG1. The first direction is parallel to the display panel.

In an embodiment, the display panel herein may be a display panel using an organic light-emitting diode display technology, that is, an organic light-emitting diode (OLED) display panel. The light-emitting element 30 of the OLED display panel comprises an anode 301, a light-emitting material layer 302 and a cathode 303. When a power supply supplies an appropriate voltage, holes in the anode 301 and electrons in the cathode 303 combine in the light-emitting material layer to generate a bright light. Compared with a film field effect transistor liquid crystal display, an OLED display device has characteristics of high visibility and high brightness, and is more power-saving, lighter and thinner. Apparently, in some other embodiments, the display panel may also be a display panel using an inorganic light-emitting diode display technology, for example, a Micro LED display panel, a Mini LED display panel, or the like.

FIG. 2 only takes the OLED display panel as an example for explanation. In one embodiment, the display layer 10 comprises a pixel definition layer 19 in which multiple pixel openings K are defined. In a direction perpendicular to the display panel, the display layer 10 further comprises an anode 301 and a cathode 303 that are respectively arranged on both sides of the pixel definition layer 19, and a light-emitting material layer 302 arranged between the anode 301 and the cathode 303. The light-emitting material layer 302 is arranged at least in the pixel openings K. The first pixel opening K1 mentioned in the embodiments of the present disclosure is filled with a light-emitting material of a first color. In an embodiment, an encapsulation layer 50 is further arranged on a side of the cathode 303 away from the anode 301. The display panel further comprises a substrate 00 and a driving layer 40 arranged between the substrate 00 and the display layer 10. The driving layer 40 is provided with a driving circuit configured to supply a driving voltage to the display layer 10, to drive the display layer 10 to emit light. In an embodiment, the driving layer 40 comprises a first metal layer m1, a capacitive metal layer mc, and a second metal layer m2 that are arranged on the substrate 00. The first metal layer m1, for example, may be a gate metal layer. A gate of a transistor in the display panel may be arranged in the first metal layer m1. The capacitive metal layer me is configured to form a capacitive structure together with the first metal layer m1 or the second metal layer m2. A source electrode s and a drain electrode d of a transistor T in the display panel may be arranged in the second metal layer m2. A semiconductor layer poly comprises a source region and a drain region. The source region and the drain region are formed by doping N-type impurity ions or P-type impurity ions. The source electrode s of the transistor is electrically connected to the source region of the semiconductor layer poly through a contact hole, and the drain electrode d of the transistor is electrically connected to the drain region of the semiconductor layer poly through a contact hole. In an embodiment, the encapsulation layer 50 is a film encapsulation layer, comprising a first inorganic layer 51, an organic layer 52 and a second inorganic layer 53, and is configured to isolate water and oxygen to avoid the influence of the external water and oxygen on the light-emitting material layer.

FIG. 1, FIG. 5, FIG. 6 and FIG. 7 illustrate feasible arrangement of pixels in the display panel, but do not limit an actual arrangement of pixels in the display panel. In some other embodiments, the pixels in the display panel may be arranged in other ways. It should be noted that the dashed lines in FIG. 6 are not actual lines in the display panel, but are configured to illustrate arrangement of fractures through when two touch electrodes are insulated from each other. The dashed lines reflect a contour of a junction of two adjacent touch electrodes. For example, the contour corresponds to a serrated contour in FIG. 4.

FIG. 3 and FIG. 4 only illustrate that the touch electrode 21 is a mutual capacitance touch electrode 21. In some other embodiments, the touch electrode 21 may be a self-capacitance structure, which is not limited in the present disclosure. Taking the mutual capacitance touch electrode 21 as an example, the touch electrode 21 comprises multiple first touch electrodes 211 and multiple second touch electrodes 212. The first touch electrodes 211 and the second touch electrodes 212 are insulated from each other. For example, the first touch electrode 211 may be an excitation electrode, and the second touch electrode 212 may be an induction electrode. In one embodiment, the first touch electrode 211 is an induction electrode, and the second touch electrode 212 is an excitation electrode. Each of the first touch electrodes 211 comprises multiple first sub-touch electrodes 2111 that are connected to each other, and each of the second touch electrodes 212 comprises multiple second sub-touch electrodes 2121 that are connected to each other. In the display panel, the first sub-touch electrode 2111 and the second sub-touch electrode 2121 each may be a block structure, a graphical structure as shown in FIG. 4, or other feasible graphical structure. In an embodiment, a virtual electrode 219 may further be provided between adjacent first sub-touch electrode 2111 and second sub-touch electrode 2121.

In an embodiment, the first sub-touch electrode 2111 and the second sub-touch electrode 2121 each comprise the metal frame WG as shown in FIG. 5. In an embodiment, an orthographic projection of the first sub-touch electrode 2111 and the second sub-touch electrode 2121 on the display panel corresponds to multiple pixel openings.

Adjacent first touch electrode 211 and second touch electrode 212 in the display panel are insulated from each other (that is, adjacent first sub-touch electrode 2111 and second sub-touch electrode 2121 are insulated from each other). During actual manufacturing, the metal frames WG are broken at corresponding positions to form the fractures DK, so as to achieve the insulation. Reference is made to FIG. 6, which shows a way in which the metal frames corresponding to the adjacent first touch electrode and second touch electrode are broken to form fractures. In related technologies, due to the presence of the fractures DK, at a large viewing angle, when viewing a displayed screen at a same angle, the arrangement of fractures on the metal frames corresponding to sub-pixels with the same color is usually irregular. Positions with the fractures are in a bright state due to light leakage from the fractures. However, positions without the fractures are in a relatively dark state when being viewed at the same angle, because there is no light leakage in these positions. Therefore, there is prone to alternate diagonal horizontal lines of brightness and darkness, that is, the problem of horizontal lines at a large viewing angle, which affects the display effect. In view of this, the positions of the fractures DK on the metal frames are improved in the embodiments of the present disclosure.

In some embodiments shown in FIG. 5 to FIG. 7, the orthographic projection of the first metal frame WG1 on the display panel corresponds to the orthographic projection of the first pixel opening K1 on the display panel, which means that the orthographic projection of the first metal frame WG1 on the display panel surrounds the orthographic projection of the first pixel opening K1 on the display panel. Taking the embodiment shown in FIG. 7 as an example, the first metal frame WG1 is regarded as a frame having a rectangular annular structure surrounding the first pixel opening K1. The first metal frame WG1 comprises the first bar B1 and the second bar B2 that are opposite to each other in the first direction D1. FIG. 5 to FIG. 7 illustrate that the first metal frame WG1 has a rectangular structure and the first pixel opening K1 has a rectangular structure. The first bar B1 and the second bar B2, which are opposite to each other in the first direction D1, of the first metal frame WG1 refer to two parallel sides of the first metal frame WG1. The first fracture DK1 refers to the fracture DK formed on the first metal frame WG1. In an embodiment, in a case that the first fracture DK1 is formed on the first metal frame WG1 corresponding to the first pixel opening K1, at least one first fracture DK1 is located on the first bar B1 of a first metal frame WG1, and at least one first fracture DK1 is located on the first bar B1 or the second bar B2 of another first metal frame WG1 (FIG. 7 illustrates that the first fracture DK1 is located on the second bar B2). In this way, at a large viewing angle, when viewing the display panel from a same angle, referring to FIG. 6, for example, when viewing the display panel at a position A, the fractures, formed on the first metal frames WG1 corresponding to the first pixel openings K1, are all located on opposite sides in the first direction D1. When the first pixel openings provided with fractures are viewed at the position A, the first pixel openings are the same in brightness even if there is light leakage at the fractures. Similarly, when viewing the display panel at a position B, the fractures, formed on the first metal frames WG1 corresponding to the first pixel openings K1, are all located on the opposite sides in the first direction D1, and light leakage at the fractures cannot be detected at the position B, and thus the brightness of these first pixel openings observed by human eyes remains consistent. Therefore, in the embodiment, sides, on which the first fractures DK1 are arranged, of different first metal frames WG1 are parallel, which is conducive to reducing a difference in visual brightness when viewing the display panel from a same angle at a large viewing angle, so as to reduce the display horizontal lines caused by the irregular arrangement of the fractures, to improve the overall display effect of the display panel.

The fractures mentioned in the above embodiments are configured to insulate the adjacent first touch electrode 211 and second touch electrode 212 from each other. Other metal frames inside the first touch electrode 211 may be provided with no fracture, and other metal frames inside the second touch electrode 212 may be provided with no fracture. In some other embodiments, in order to improve the consistency of visual brightness at an angle at a large viewing angle, other metal frames inside the first touch electrode 211 and other metal frames inside the second touch electrode 212 may also be provided with fractures. For example, for the first metal frames inside the first touch electrode 211 and the second touch electrode 212, fractures may be arranged on sides that are opposite to each other in the first direction D1 (i.e. sides extending in the second direction D2) (but it is required to ensure the electrical connection between the metal frames inside the first touch electrode or the second touch electrode), and when the first pixel openings are viewed at an angle at a large viewing angle, light leakages corresponding to various first pixel openings are the same at positions on the interior and the edge of a same touch electrode, to facilitate improving the consistency of visual brightness at a same angle at a large viewing angle.

The embodiment shown in FIG. 7 shows a solution in which the first fractures are arranged on the sides, opposite to each other in the first direction, of the first metal frames in a case that the first metal frames corresponding to the first pixel openings K1 are provided with the first fractures. In addition, in some other embodiments, in a case that the first metal frames are provided with the first fractures, the first fractures may also be arranged on the sides, opposite to each other in the second direction, of the first metal frames. The embodiment shown in FIG. 7 only shows a solution in which some of the first metal frames each are provided with only one fracture. In some other embodiments, each first metal frame may be provided with two fractures. For example, referring to FIG. 6, for each first metal frame provided with a fracture, the first metal frame corresponding to each first pixel opening K1 may be provided with two first fractures that are respectively formed on two sides, opposite to each other in the first direction, of the first metal frame. Apparently, in some other embodiments, the two first fractures of the first metal frame may also be formed on two sides, which are opposite in the second direction, of the first metal frame, which is not limited in the present disclosure.

It should be noted that FIG. 6 and FIG. 7 only show the arrangement of fractures of the first metal frames corresponding to a part of first pixel openings. In a case that the first metal frames corresponding to other first pixel openings are provided with fractures, the fractures may be arranged with reference to the arrangement shown in FIG. 6 or FIG. 7.

Assuming that the metal frame is composed of four sides that are connected from end to end, in a case that the metal frame is provided with the fracture DK, the fracture DK may be located at a middle of a side among the four sides. Apparently, in some other embodiments, the fracture DK may be located at other position of a side among the four sides, which is not limited in the present disclosure.

In the embodiment, the light-emitting elements corresponding to the first pixel openings K1 have a same color. For example, the light-emitting elements are all red light-emitting elements, all green light-emitting elements, or all blue light-emitting elements. In one embodiment, the first pixel openings correspond to the red light-emitting elements, the fractures DK of the first metal frames WG1 adopt the above design, which is conducive to reducing the horizontal lines of a red screen at a large viewing angle. In the embodiments, different pixel openings are filled with different fillers only for distinguishing different pixel openings rather than limiting structures of the pixel openings.

Figure 8:
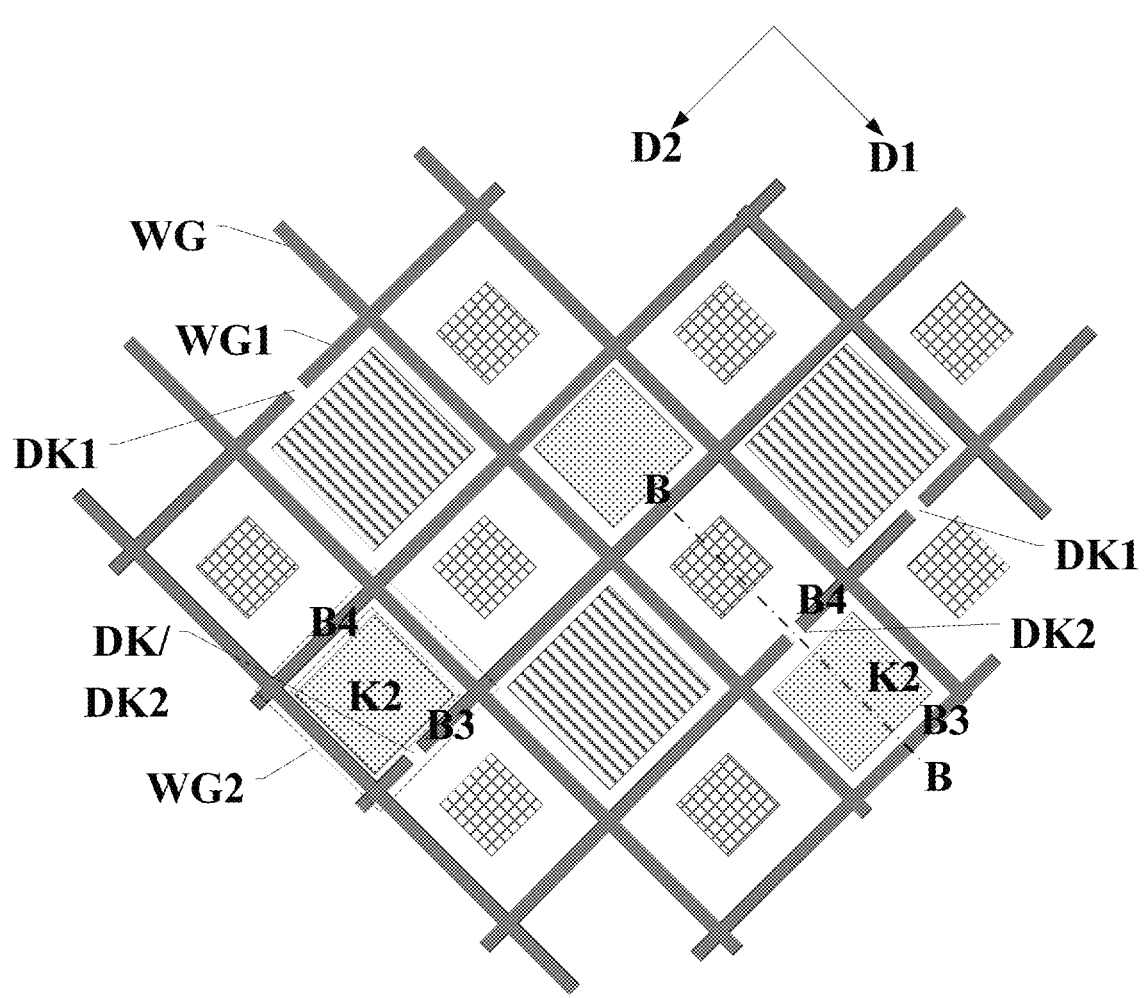
FIG. 8 is a schematic diagram showing another relative position relationship between pixel openings and metal frames of touch electrodes according to an embodiment of the present disclosure.

FIG. 8 is a diagram showing another relative position relationship between the pixel openings and the metal frames of the touch electrode 21 according to an embodiment of the present disclosure. Referring to FIG. 8, in one embodiment, the pixel opening comprises multiple second pixel openings K2. Light-emitting elements corresponding to the second pixel openings K2 all have a same light-emitting color, and the light-emitting color is a second color different from the first color.

The metal frame comprises a second metal frame WG2. An orthographic projection of the second metal frame WG2 on the display panel corresponds to an orthographic projection of the second pixel opening K2 on the display panel, and the second metal frame WG2 comprises a third bar B3 and a fourth bar B4 that are opposite to each other in the first direction D1. The fracture DK comprises a second fracture DK2. At least one second fracture DK2 is located on the third bar B3 of a second metal frame WG2, and at least one second fracture DK2 is located on the third bar B3 or the fourth bar B4 of another second metal frame WG2 (the embodiment shown in FIG. 8 illustrates that the at least one second fracture is located on the fourth bar B4).

In a case that the display panel is further provided with the second pixel openings K2, the light-emitting color of the light-emitting elements corresponding to the second pixel openings K2 is the second color different from the first color. For example, in a case that the first color is red, the second color may be green, blue, or the like. The orthographic projection of the second metal frame WG2 on the display panel is located on a periphery of the orthographic projection of the second pixel opening K2 on the display panel and is located surrounding the second pixel opening K2. In a case that the touch electrodes are insulated from each other through the fractures DK, the fractures DK may be formed on the first metal frames WG1 or the second metal frames WG2. In the embodiments, the first fractures DK1 are regarded as fractures formed on the first metal frames WG1, and the second fractures DK2 are regarded as fractures formed on the second metal frames WG2.

The second metal frame WG2 comprises the third bar B3 and the fourth bar B4 that are opposite to each other in the first direction D1. At least one second fracture DK2 is located on the third bar B3 of a second metal frame WG2, and at least one second fracture DK2 is located on the third bar B3 or the fourth bar B4 of another second metal frame WG2. In this way, the sides, on which the second fractures DK2 are located, of the second metal frames WG2 are parallel. Therefore, when viewing the displayed screen from a same angle at a large viewing angle, lights with the second color emitted by the light-emitting elements in the second pixel openings K2 have the same or similar amount of light leakage at positions corresponding to the second pixel openings K2 provided with the second fractures DK2, which is conducive to reducing the difference in visual brightness when viewing the display panel from a same angle at a large viewing angle, and thus is conducive to reducing the display horizontal lines caused by the irregular arrangement of fractures, to facilitate improving the overall display effect of the display panel.

In a case that the first fracture DK1 is located on the first bar B1 or the second bar B2 of the first metal frame WG1 where the first bar B1 and the second bar B2 are opposite to each other in the first direction D1, the second fracture DK2 is located on the third bar B3 or the fourth bar B4 of the second metal frame WG2 where the third bar B3 and the fourth bar B4 are opposite to each other in the first direction D1, sides, on which the first fracture DK1 and the second fracture DK2 are located, in the first metal frame WG1 and the second metal frame WG2 are parallel, which is conducive to reducing the horizontal lines of the display panel at a large viewing angle and simplifying a manufacturing process of forming the first fractures DK1 and the second fractures DK2 on the touch layer 20, to improve the efficiency of producing the display panel.

It should be noted that in order to further improve the consistency of visual brightness at a large viewing angle, the second fractures DK2 may be provided on the second metal frames inside the touch electrodes, and are formed on sides, extending in a same direction, of the second metal frames WG2.

The embodiment shown in FIG. 8 only shows a solution that a part of the second metal frames each are provided with only one fracture. In some other embodiments, each second metal frame may also be provided with two fractures, which is not limited in the present disclosure.

Figure 9:
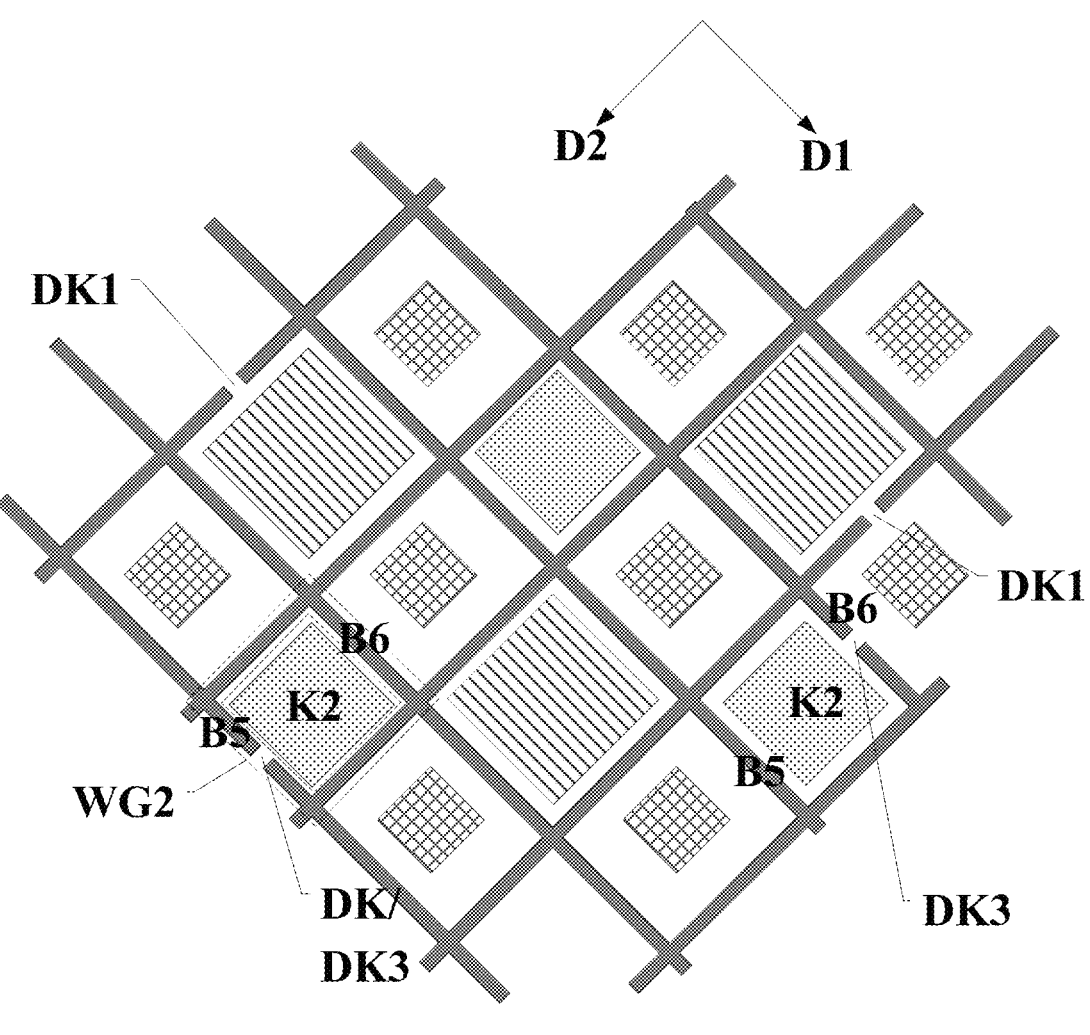
FIG. 9 is a schematic diagram showing another relative position relationship between pixel openings and metal frames of touch electrodes according to an embodiment of the present disclosure.

In a case that the first metal frame WG1 and the second metal frame WG2 each are provided with the fractures DK, the embodiment shown in FIG. 8 shows the solution that the first fractures DK1 and the second fractures DK2 are both arranged on sides that are opposite to each other in the first direction D1. That is, the sides where the first fractures DK1 and the second fractures DK2 are arranged have a same extension direction. In some other embodiments, a side, provided with the second fracture DK2, in the second metal frame WG2 and a side, provided with the second fractures DK2, in the first metal frame WG1 may be different in extension direction. Reference is made to FIG. 9, which shows another relative position relationship between the pixel openings and the metal frames of the touch electrode 21 according to an embodiment of the present disclosure.

Reference is made to FIG. 6 and FIG. 9, in an embodiment, the pixel opening comprises multiple second pixel openings K2. The light-emitting color of the light-emitting elements corresponding to the second pixel openings K2 is the second color different from the first color.

The metal frame comprises the second metal frame WG2. The orthographic projection of the second metal frame WG2 on the display panel corresponds to the orthographic projection of the second pixel opening K2 on the display panel. The second metal frame WG2 comprises a fifth bar B5 and a sixth bar B6 that are opposite to each other in the second direction D2. The fracture DK comprises a third fracture DK3. At least one third fracture DK3 is located on the fifth bar B5 of a second metal frame WG2, and at least one third fracture DK3 is located on the fifth bar B5 or the sixth bar B6 of another second metal frame WG2 (the embodiment shown in FIG. 9 illustrates that the at least one third fracture DK3 is located on the sixth bar B6). The second direction D2 is parallel to the display panel, and the second direction D2 intersects with the first direction D1.

This embodiment shows a solution in which in a case that the second fractures DK2 are formed on the second metal frames WG2, a part of the second fractures DK2 are located on the fifth bars B5 of a second metal frames WG2 and another part of the second fractures DK2 are located on the sixth bars B6 of another second metal frames WG2. The fifth bar B5 and the sixth bar B6 are opposite to each other in the second direction D2. An extension direction of the fifth bar B5 and the sixth bar B6 intersects with the extension direction of the first bar B1 and the second bar B2 in the first metal frame WG1. It should be noted that in a case that the metal frames corresponding to the pixel openings, which correspond to the light-emitting elements with different colors, are provided with the fractures DK, for example, in a case that a part of the first metal frames WG1 are provided with fractures and a part of the second metal frames WG2 are provided with fractures, as long as the sides, on which the fractures DK are located, in the first metal frames WG1 are opposite to each other in a direction and the sides, on which the fractures DK are located, in the second metal frames WG2 are opposite to each other in another direction, the horizontal lines at a large viewing angle can be reduced whether the two directions are the same or different.

The embodiment shown in FIG. 9 only shows a solution in which a part of the second metal frames each are provided with only one fracture. In some other embodiments, one second metal frame may be provided with two fractures. Referring to FIG. 6, for the second metal frames provided with fractures, the second metal frame corresponding to each second pixel opening K2 may be provided with two second fractures that are respectively located on two sides, which are opposite to each other in the second direction, in the second metal frame. Apparently, in some other embodiments, the two second fractures on the second metal frame may also be respectively located on two sides, opposite to each other in the first direction, in the second metal frame, which is not limited in the present disclosure.

It should also be noted that the dashed line in the embodiment shown in FIG. 6 is a contour line connecting the fractures, and a contour of edges of the two touch electrodes can be seen through the dashed line. For a first sub-touch electrode 2111 or a second sub-touch electrode 2121, sides, on which fractures are located, in the first metal frame corresponding to the first pixel opening are parallel, and sides, on which fractures are located, in the second metal frame corresponding to the second pixel opening are parallel. Accordingly, for a touch electrode, sides, on which fractures are located, in the first metal frame corresponding to the first pixel opening are parallel, and sides, on which fractures are located, in the second metal frame corresponding to the second pixel opening are parallel. The embodiment shown in FIG. 6 illustrates that sides, on which fractures are located, in the first metal frame extend in the second direction D2, and sides, on which fractures are located, in the second metal frame extend in the first direction D1. In an embodiment, the first pixel opening corresponds to one of the red light-emitting element and the blue light-emitting element, and the second pixel opening corresponds to the other of the red light-emitting element and the blue light-emitting element.

Figure 10:
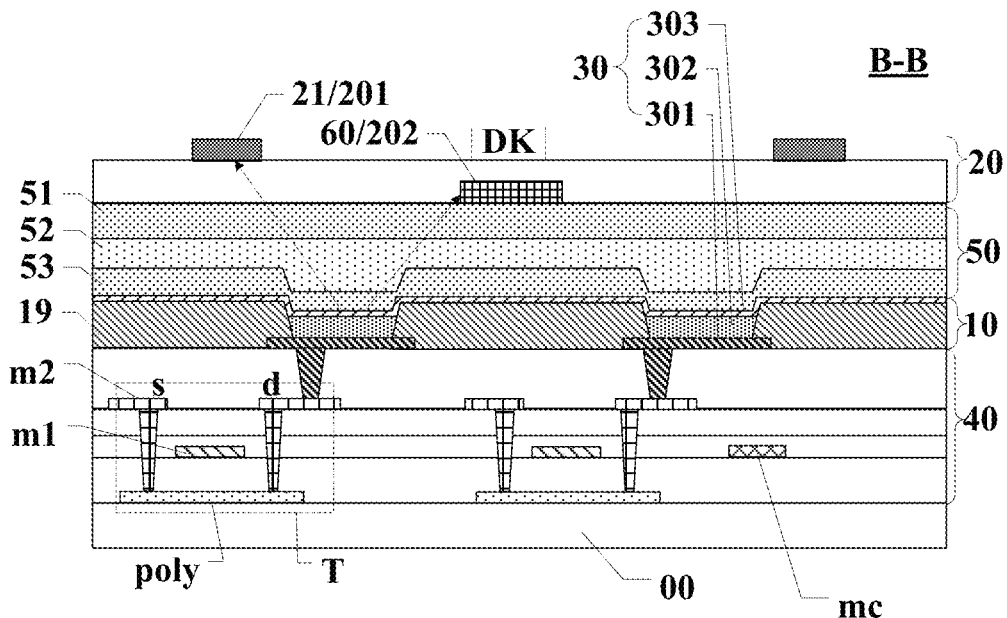
FIG. 10 is a cross section view of FIG. 8 in a direction indicated by BB.

FIG. 10 is a cross section view of FIG. 8 in a direction indicated by BB. This embodiment shows a solution in which the display panel further comprises a light blocking part 60.

Referring to FIG. 10, in one embodiment, the display panel further comprises a light blocking part 60. The light blocking part 60 at least partially overlaps with the fracture DK in a direction perpendicular to the display panel.

In a case that the display panel comprises the light blocking part 60, the light blocking part 60 is arranged in the light-emitting direction of the light-emitting element, that is, on a side of the light-emitting element towards the touch layer 20. An orthographic projection of the light blocking part 60 on the display panel at least partially overlaps with an orthographic projection of the fracture DK on the display panel. In a case that the light blocking part 60 is not introduced into the display panel, at least a part of lights emitted by the light-emitting element may exit from the position where the fracture DK is located. In a case that the light blocking part 60 is introduced into the display panel, the light blocking part 60 overlaps with the fracture DK in the direction perpendicular to the display panel, and at least a part of the lights emitted by the light-emitting element are blocked by the light blocking part 60 rather than emitting from the position where the fracture DK is located, which is conducive to reducing the amount of light emitting from the fracture DK. In a case that the amount of light emitting from the fracture DK is reduced, when the display panel is viewed from an angle at a large viewing angle, even if light leakage from the fractures is viewed, the amount of the light leakage that can be viewed is reduced. In addition, in a case that the light leakage from the fractures is reduced, the amount of the light leakage in a region where the metal frame with the fracture is located tends to be the same with the amount of the light leakage in a region where the metal frame without the fracture is located, which is also conducive to improving the consistency in visual brightness when viewing the display panel from a same angle, to reduce the horizontal lines of the display panel at a large viewing angle and improving the display effect of the display panel.

Figure 11:
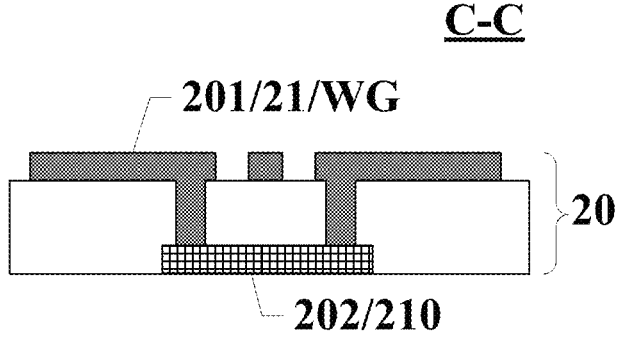
FIG. 11 is a cross section view of a touch layer in FIG. 4 in a direction indicated by CC.

FIG. 11 is a cross section view of the touch layer in FIG. 4 in a direction indicated by CC. Reference is made to FIG. 10 and FIG. 11, in one embodiment, the touch layer 20 comprises an electrode layer 201 and a bridge layer 202. The bridge layer 202 is arranged between the electrode layer 201 and the display layer 10. The metal frames are arranged in the electrode layer 201. The bridge layer 202 comprises multiple bridges 210. At least some of the metal frames WG are electrically connected through the bridges 210. Referring to FIG. 10 and FIG. 11, the light blocking part 60 is arranged in the bridge layer 202, and the light blocking part 60 is insulated from the bridges 210.

Referring to FIG. 4, FIG. 10 and FIG. 11, in the display panel herein, the touch layer 20 comprises two conductive layers, namely, the electrode layer 201 and the bridge layer 202. The electrode layer 201 is configured to arrange touch electrodes 21. In a case that the touch electrode 21 is the mutual capacitance touch electrode 21, the first touch electrode 211 and the second touch electrode 212 are insulated from each other. The first touch electrode 211 and the second touch electrode 212 each comprise multiple electrode blocks. In a case that the electrode blocks in the first touch electrode 211 are electrically connected through a conductive structure in the electrode layer 201, the electrode blocks in the second touch electrode 212 are electrically connected through the bridge 210 in the bridge layer 202 in order to avoid a short circuit between the first touch electrode 211 and the second touch electrode 212. In a case that the light blocking part 60 is introduced into the display panel to block the light exiting from the fracture DK and set in the bridge layer 202 in this embodiment, the bridge layer 202 is reused as the light blocking part 60 rather than introducing a separate film into the display panel as the light blocking part 60, which is conducive to simplifying a film structure of the display panel. In practical manufacture, the light blocking part 60 and the bridge 210 in the bridge layer 202 may be manufactured in a same procedure and a separate procedure for manufacturing the light blocking part 60 is unnecessary, which is conducive to simplifying an overall procedure for manufacturing the display panel after introducing the light blocking part 60, to improve the efficiency of producing the display panel.

In an embodiment, referring to FIG. 10, in the display panel according to the embodiments of the present disclosure, the electrode layer 201 in the touch layer 20 is arranged on a side of the bridge layer 202 away from the display layer 10. That is, the electrode layer 201 is closer to a light emitting surface of the display panel, which is conducive to reducing a distance between the touch electrode 21 and a body touching the display panel, to improve the touch sensitivity of the display panel.

In a case that the bridge layer 202 is arranged on a side of the electrode layer 201 towards the display layer 10, and the light blocking part 60 is set in the bridge layer 202, the light blocking part 60 is arranged on a side of the fracture DK towards the display layer 10. In some other embodiments, the light blocking part 60 may be arranged at other position. For example, reference is made to FIG. 12, which is another cross section view of FIG. 8 in the direction indicated by BB, and this embodiment shows another solution in which the display panel is provided with the light blocking part 60.

Figure 12:
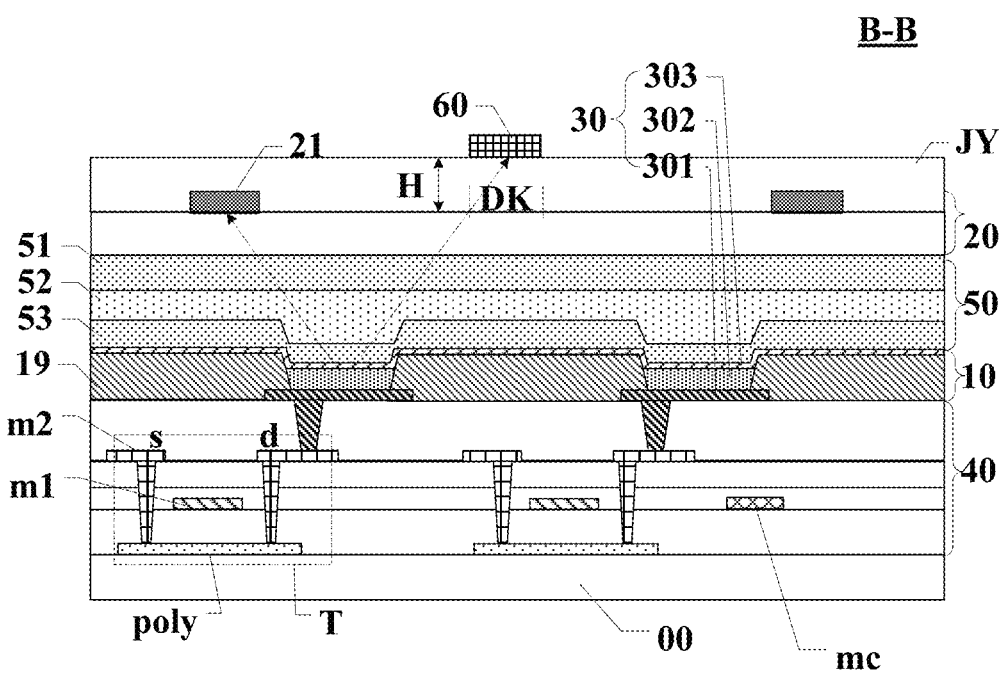
FIG. 12 is another cross section view of FIG. 8 in the direction indicated by BB.

Referring to FIG. 12, in one embodiment, the light blocking part 60 is arranged on a side of the touch layer 20 away from the display layer 10.

In a case that the light blocking part 60 is arranged on the side of the touch layer 20 away from the display layer 10, since the fracture DK is located on the metal frame corresponding to the touch electrode 21 in the touch layer 20, it is equivalent to arranging the light blocking part 60 on the side of the fracture DK away from the display layer 10. When a light from the display layer 10 is incident on the fracture DK and further emits from the position where the fracture is located, it is equivalent to setting the light blocking part 60 in a direction in which the light emits from the fracture DK. Therefore, the light exiting from the fracture DK to the light emitting surface of the display panel may be blocked well by the light blocking part 60 rather than emitting in a direction at a large viewing angle. Therefore, the light being blocked is conducive to reducing the horizontal lines of the display panel caused by light leakage at a large viewing angle.

Referring to FIG. 12, in one embodiment, in the direction perpendicular to the display panel, the light blocking part 60 and the fracture DK are isolated by an insulating layer JY.

In a case that the light blocking part 60 is arranged on the side of the touch layer 20 away from the display layer, the insulating layer JY is provided on a side of the touch layer 20 away from the display layer 10, and the light blocking part 60 is arranged on a side of the insulating layer JY away from the touch layer 20. In this case, the light blocking part 60 may be made of a light blocking metal material. The light blocking metal material has a better light blocking effect, which is conducive to reducing the light leakage at the fracture.

Figure 13:
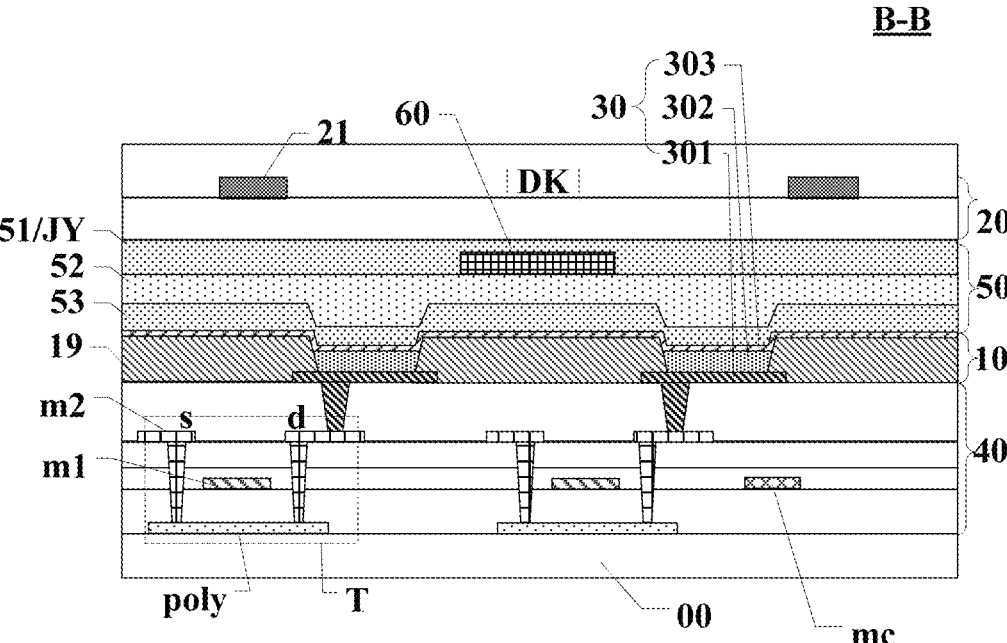
FIG. 13 is another cross section view of FIG. 8 in the direction indicated by BB.
Figure 14:
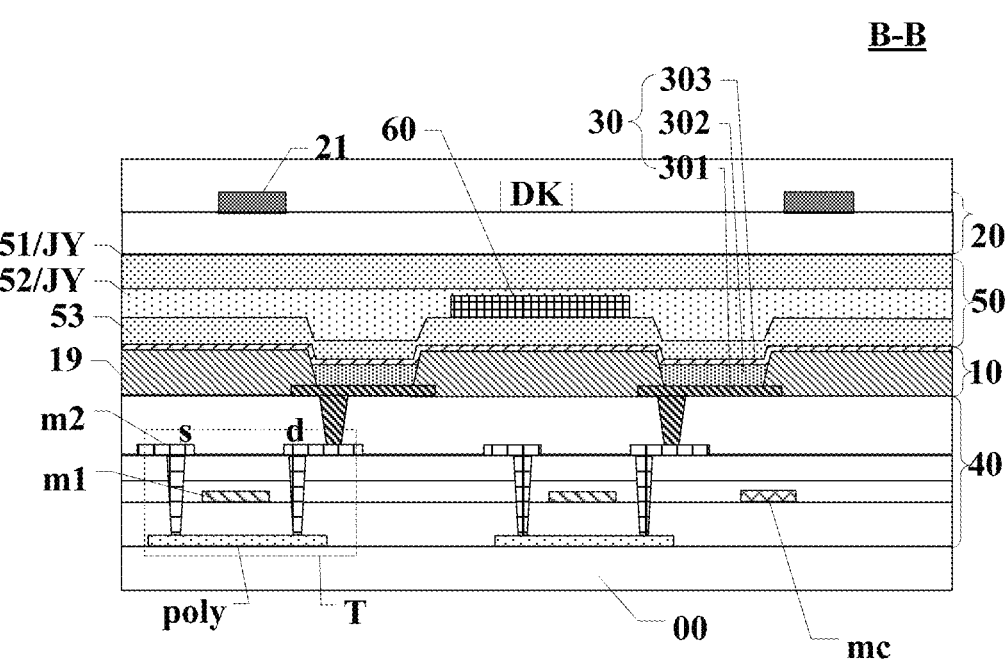
FIG. 14 is another cross section view of FIG. 8 in the direction indicated by BB.

In a case that the light blocking part 60 is arranged on a side of the touch layer 20 facing the display layer, the light blocking part 60 and the fracture DK may also be isolated by the insulating layer JY Reference is made to FIG. 13 and FIG. 14. FIG. 13 is another cross section view of FIG. 8 in the direction indicated by BB and FIG. 14 is another cross section view of FIG. 8 in the direction indicated by BB. Reference is made to FIG. 13, in a case that the encapsulation layer 50 comprises multiple stacked films, for example, the first inorganic layer 51, the organic layer 52 and the second inorganic layer 53 that are stacked, the first inorganic layer 51 is arranged on a side of the organic layer 52 facing the touch layer 20, and the second inorganic layer 53 is arranged on a side of the organic layer 52 facing the display layer 10. The light blocking part 60 may be arranged between the first inorganic layer 51 and the organic layer 52. In addition, the first inorganic layer 51 may be regarded as the insulating layer JY between the light blocking part 60 and the fracture DK. Therefore, it is unnecessary to provide an additional insulating layer in the display panel, to simplify the film structure of the display panel. In some other embodiments, reference is made to FIG. 14, the light blocking part 60 may also be arranged between the organic layer 52 and the second inorganic layer 53. In this case, the organic layer 52 and the first inorganic layer 51 may be regarded as the insulating layers JY between the light blocking part 60 and the fracture DK, and therefore it is unnecessary to provide an additional insulating layer in the display panel, to simplify the film structure of the display panel.

Figure 15:
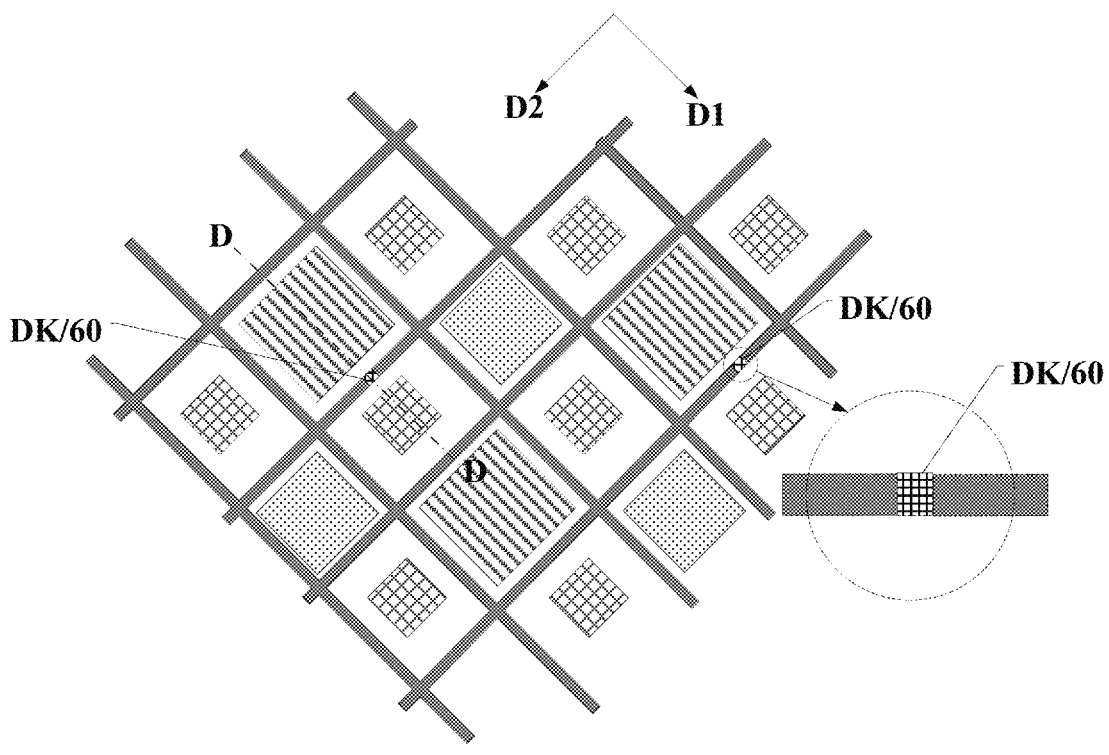
FIG. 15 is a schematic diagram showing another relative position relationship between pixel openings and metal frames of touch electrodes according to an embodiment of the present disclosure.
Figure 16:
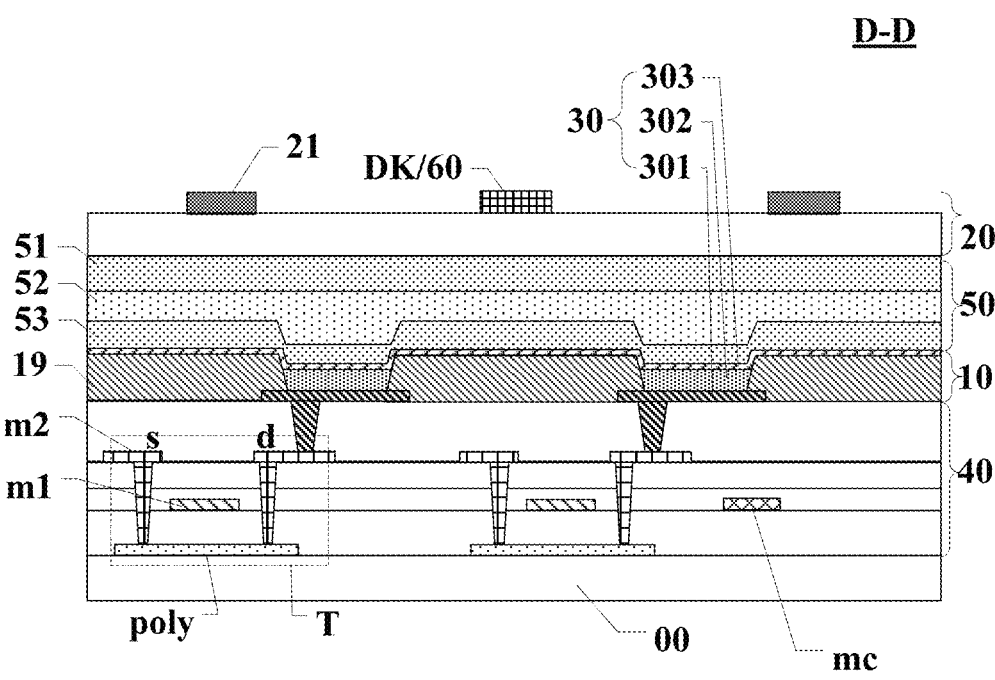
FIG. 16 is a cross section view of FIG. 15 in a direction indicated by DD.

The above embodiments show the solution in which the light blocking part 60 is located on the side of the fracture DK facing the display layer 10 or the side of the fracture DK away from the display layer 10. In some other embodiments, the light blocking part 60 may also be located in the fracture DK. Reference is made to FIG. 15 and FIG. 16, FIG. 15 is a schematic diagram showing a relative position relationship between pixel openings and metal frames of the touch electrodes 21 according to an embodiment of the present disclosure, and FIG. 16 is a cross section view of FIG. 15 in a direction indicated by DD.

Reference is made to FIG. 15 and FIG. 16, in one embodiment, the light blocking part 60 is made of an insulating material, and the light blocking part 60 is at least filled in the fracture DK.

This embodiment shows a solution in which the light blocking part 60 is at least partially filled in the fracture DK. During practical manufacturing, after the fractures DK are formed in the metal frames of the touch electrodes 21, light blocking parts 60 are filled at positions where the fractures DK are located, and then other films are manufactured. The light blocking parts 60 filled in the fractures DK serve as an insulating layer having a light blocking effect. In a case that the light blocking parts 60 are filled in the fractures DK, the light blocking parts 60 effectively fill gaps at the positions where the fractures DK are located, and light blocking effect of various positions in the metal frames is consistent, which effectively reduces the light leakage at the fractures DK at a large viewing angle, and thus is conducive to reducing the display horizontal lines of the display panel caused by the light leakage at the fractures DK. In an embodiment, in a case that the light blocking part 60 is filled in the fracture DK, a width of the light blocking part 60 is the same as a width of the fracture DK on the metal frame.

In one embodiment, in the direction perpendicular to the display panel, a width H of a gap between the light blocking part 60 and the fracture DK is greater than or equal to 0 and less than or equal to 3 μm.

In a case that the light blocking part 60 is introduced in the display panel, reference is made to FIG. 15 and FIG. 16, the light blocking part 60 is filled in the fracture DK, thus the width of the gap between the light blocking part 60 and the fracture DK may be regarded as 0. In addition, in a case that the light blocking part 60 is arranged on the side of the fracture DK facing or away from the display layer 10, reference is made to FIG. 12, a small width of the gap between the light blocking part 60 and the fracture DK is conducive to avoiding the light leakage at the fracture DK, and a large width of the gap between the light blocking part 60 and the fracture DK, for example, greater than 3 μm, is not conducive to blocking the light at a large viewing angle. Therefore, in an embodiment, the width of the gap between the light blocking part 60 and the fracture DK is set to be less than or equal to 3 μm, which is conducive to ensuring a shielding effect of the light blocking part 60 on the light leakage at the fracture DK and reducing the horizontal lines at a large viewing angle caused by the light leakage at the fracture DK.

Figure 17:
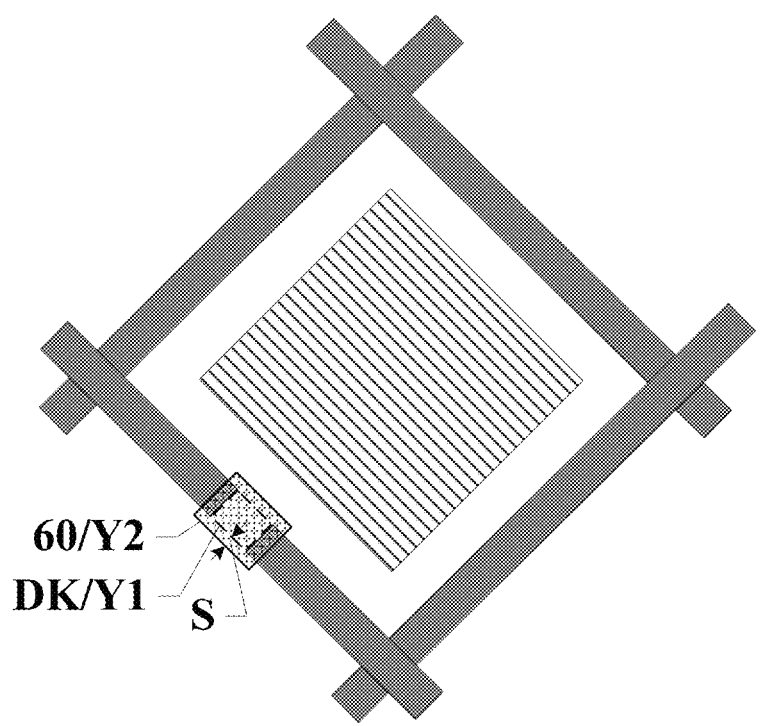
FIG. 17 is a diagram showing a relative position relationship between a fracture and a light blocking part.

FIG. 17 is a diagram showing a relative position relationship between the fracture DK and the light blocking part 60. Reference is made to FIG. 17, in one embodiment, in the corresponding fracture DK and the light blocking part 60, an orthographic projection of the fracture DK on the display panel is a first projection Y1, and an orthographic projection of the light blocking part 60 on the display panel is a second projection Y2. The first projection Y1 is located within the second projection Y2, and a minimum distance S between a contour of the first projection Y1 and a contour of the second projection Y2 is greater than or equal to 1 μm.

Reference is made to FIG. 12 to FIG. 14, and FIG. 17, in a case that the light blocking part 60 is arranged on the side of the fracture DK facing or away from the display layer 10, an area of the contour of the second projection Y2 corresponding to the light blocking part 60 may be larger than an area of the contour of the first projection Y1 corresponding to the fracture DK, and the first projection Y1 is within the second projection Y2. A gap is formed between the contour of the second projection Y2 and the contour of the first projection Y1. The minimum distance S between the contour of the first projection Y1 and the contour of the second projection Y2 is a minimum width of the gap. The minimum width is set to be greater than or equal to 1 μm, which is conducive to increasing a light blocking area of the light blocking part 60. For example, when the light from the display layer 10 is incident on the fracture DK and further exits from the fracture DK, the light may diffuse from the periphery of the fracture DK. In a case that the contour of the light blocking part 60 is outward at least 1 μm relative to the contour of the fracture DK, the light diffusing to the periphery of the fracture DK can be blocked, which is conducive to improving the light blocking effect of the light blocking part 60, to reduce the display horizontal lines of the display panel caused by the light leakage at the fracture DK.

Figure 18:
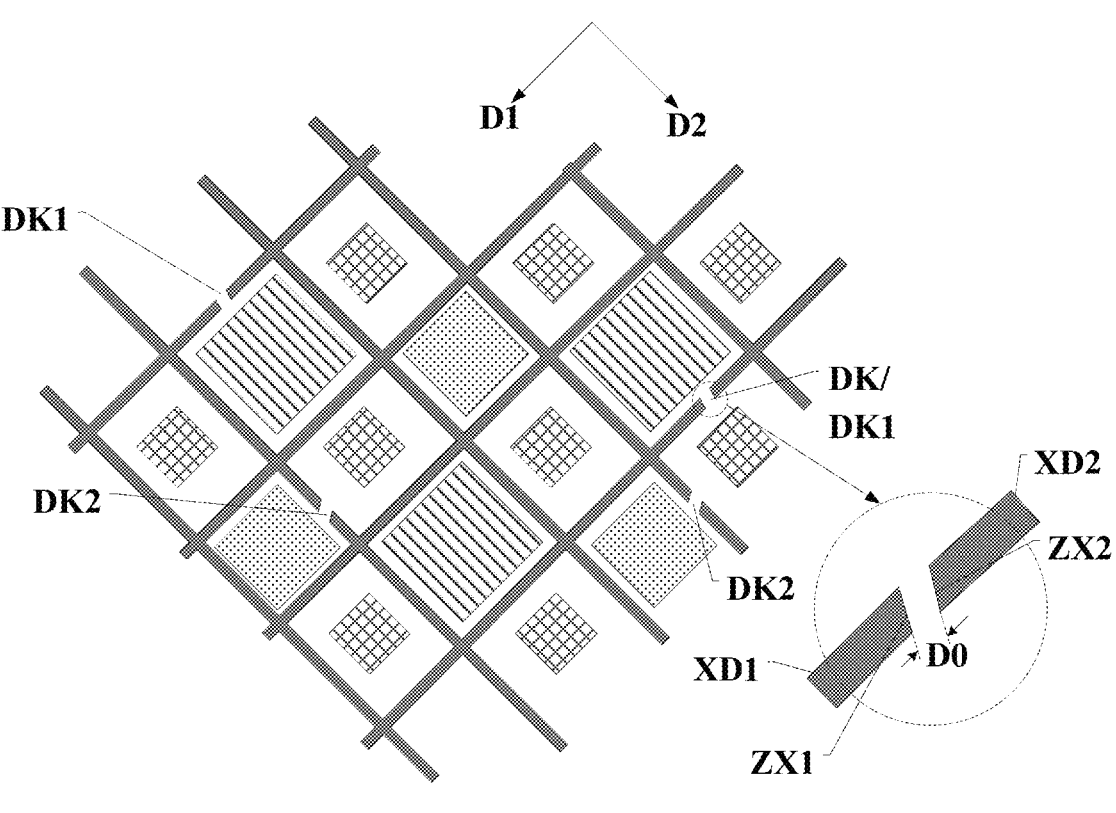
FIG. 18 is another schematic structural diagram of a fracture on a metal frame.

FIG. 18 is another schematic structural diagram of the fracture DK on the metal frame. Reference is made to FIG. 7 and FIG. 18. In one embodiment, among adjacent touch electrodes 21, a touch electrode 21 comprises a first segment XD1, and the another touch electrode 21 comprises a second segment XD2. A surface of the first segment XD1 facing the second segment XD2 is a first side surface, and a surface of the second segment XD2 facing the first segment XD1 is a second side surface. The fracture DK is arranged between the first side surface and the second side surface. An orthographic projection of the first side surface on the display panel is a first straight segment ZX1, an orthographic projection of the second side surface on the display panel is a second straight segment ZX2, and the first straight segment ZX1 is parallel to the second straight segment ZX2.

In an embodiment, the fracture DK is introduced in the metal frame to ensure the insulation between adjacent touch electrodes. It is assumed that among two adjacent touch electrodes, a touch electrode comprises the first segment XD1 and another touch electrode comprises the second segment XD2. In a case that the fracture DK is not formed, the first segment XD1 and the second segment XD2 are connected. The fracture DK may be regarded as an opening formed after cutting a complete segment. The complete segment is divided into the first segment XD1 and the second segment XD2 by the fracture DK. An interval between the opposite side surfaces of the first segment XD1 and the second segment XD2 is the position where the fracture DK is located. The orthographic projection of the first side surface corresponding to the first segment XD1 on the display panel is the first straight segment ZX1, and the orthographic projection of the second side surface corresponding to the second segment XD2 on the display panel is the second straight segment ZX2. The first straight segment ZX1 is parallel to the second straight segment ZX2. That is, the side surfaces on both sides of the fracture DK are parallel. The fracture DK is formed with parallel side surfaces, which is conducive to simplifying an entire process of manufacturing the display panel.

Reference is made to FIG. 7, in one embodiment, in at least a part of the fractures DK, an extension direction of the first straight segment ZX1 is perpendicular to an extension direction of the first segment XD1.

In a case that the extension direction of the first straight segment ZX1 and the second straight segment ZX2 is perpendicular to the extension direction of the first segment XD1, the fracture DK is a flat fracture DK. In practical manufacturing, the flat fracture DK may be formed by cutting the metal frame in a flat cutting manner, which is conducive to simplifying the process of manufacturing the display panel.

Reference is made to FIG. 18, in one embodiment, in at least a part of the fractures DK, the extension direction of the first straight segment ZX1 is not parallel to and not perpendicular to the extension direction of the first segment XD1.

In a case that the extension direction of the first straight segment ZX1 and the second straight segment ZX2 is not parallel to and not perpendicular to the extension direction of the first segment XD1, the fracture DK is an oblique fracture DK. In practical manufacturing, the oblique fracture DK may be formed by cutting the metal frame in an oblique cutting manner, which is also conducive to simplifying the process of manufacturing the display panel.

Reference is made to FIG. 7 and FIG. 18, in one embodiment, a minimum distance D0 between the first straight segment ZX1 and the second straight segment ZX2 corresponding to a same fracture DK is less than or equal to 2.5 µm.

In an embodiment, the minimum distance between the first straight segment ZX1 and the second straight segment ZX2 is the minimum width of fracture DK. On a premise that the width of the fracture DK is greater than 0, a small width of fracture DK is conducive to reducing the light leakage. Considering a limitation of the process, in an embodiment, the width of fracture DK is set to be less than or equal to 2.5 µm. For example, D0 is set to be equal to 2 µm, which not only ensures the insulation between the adjacent touch electrodes 21, but also is conducive to reducing the light leakage at the fracture DK.

Figure 19:
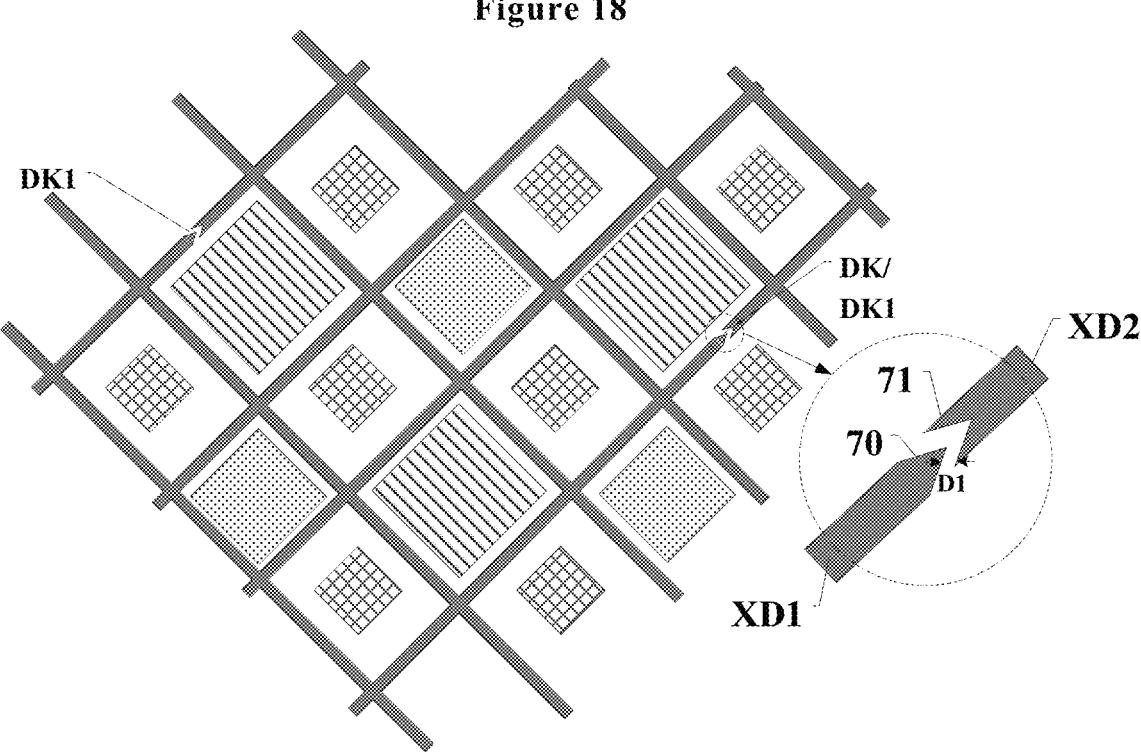
FIG. 19 is another schematic structural diagram of the fracture on the metal frame.
Figure 20:
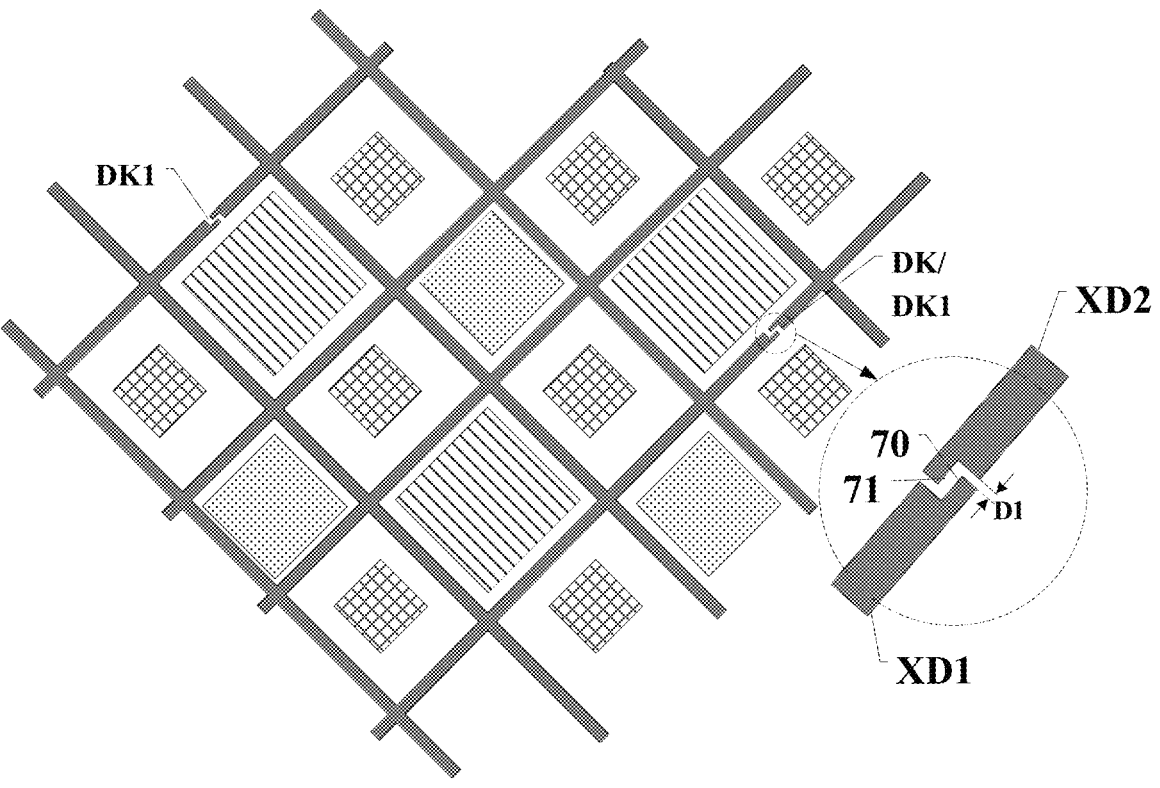
FIG. 20 is another schematic structural diagram of the fracture on the metal frame.

FIG. 19 and FIG. 20 are schematic structural diagrams of the fracture on the metal frame, respectively. This embodiment shows a solution in which the fracture DK is in other shape.

Reference is made to FIG. 19 and FIG. 20, in one embodiment, among the adjacent touch electrodes, one touch electrode comprises a first segment XD1, and another touch electrode comprises a second segment XD2. A surface of the first segment XD1 facing the second segment XD2 is a first side surface, and a surface of the second segment XD2 facing the first segment XD1 is a second side surface. The fracture DK is arranged between the first side surface and the second side surface. An orthographic projection of the first side surface on the display panel comprises a first convex curve 70, and an orthographic projection of the second side surface on the display panel comprises a first concave curve 71. A shape of the first convex curve 70 fits with a shape of the first concave curve 71.

This embodiment shows a solution in which the fracture DK on the metal frame is in an irregular shape. The embodiments shown in FIG. 19 and FIG. 20 show solutions in which the first side surface of the first segment XD1 comprises the first convex curve 70, and the second side surface of the second segment XD2 comprises the first concave curve 71. The shape of the fracture DK in the embodiment shown in FIG. 19 is a triangle, and the shape of the fracture DK in the embodiment shown in FIG. 20 is a polygonal line. For the fracture DK having a triangular structure, the fracture DK forms two light outlet channels that are connected. When the light emitted by the light-emitting element of the display layer exits through the fracture DK having a triangular structure, the light passes through the two light outlet channels, which is equivalent to increasing a transmission path of the light. The light is attenuated in transmission. Therefore, when the light emitted by the light-emitting element passes through the light outlet channels in the fracture DK having a triangular structure, the reserve of the light is reduced. That is, the light leakage of the fracture DK is reduced, which is conducive to reducing the display horizontal lines caused by the light leakage at the fractures DK.

Similarly, for the fracture DK having a polygonal line structure, the fracture DK forms three light outlet channels that are connected. When the light emitted by the light-emitting element exits through the fracture DK having a polygonal line structure, the light passes through the three channels, which further extend the transmission path of the light. Therefore, the light is attenuated more in transmission, which is more conducive to reducing the light leakage at the fracture DK, and reducing the display horizontal lines caused by the light leakage at the fractures DK.

Reference is made to FIG. 19 and FIG. 20, in one embodiment, the maximum width D1 of the gap between the first side surface and the second side surface is less than or equal to 2.5 μm. On a premise of ensuring the insulation between the first side surface and the second side surface, a smaller width of the gap between the first side surface and the second side surface is conducive to reducing the light leakage at the fracture DK. Furthermore, considering the process difficulty, in the embodiment, a maximum width of the gap between the first side surface and the second side surface is less than or equal to 2.5 μm. For example, D1 may be equal to 2 μm, which is not only conducive to reducing the light leakage at the fracture DK, but also conducive to ensuring the insulation between the touch electrodes on both sides of the fracture DK.

Figure 21:
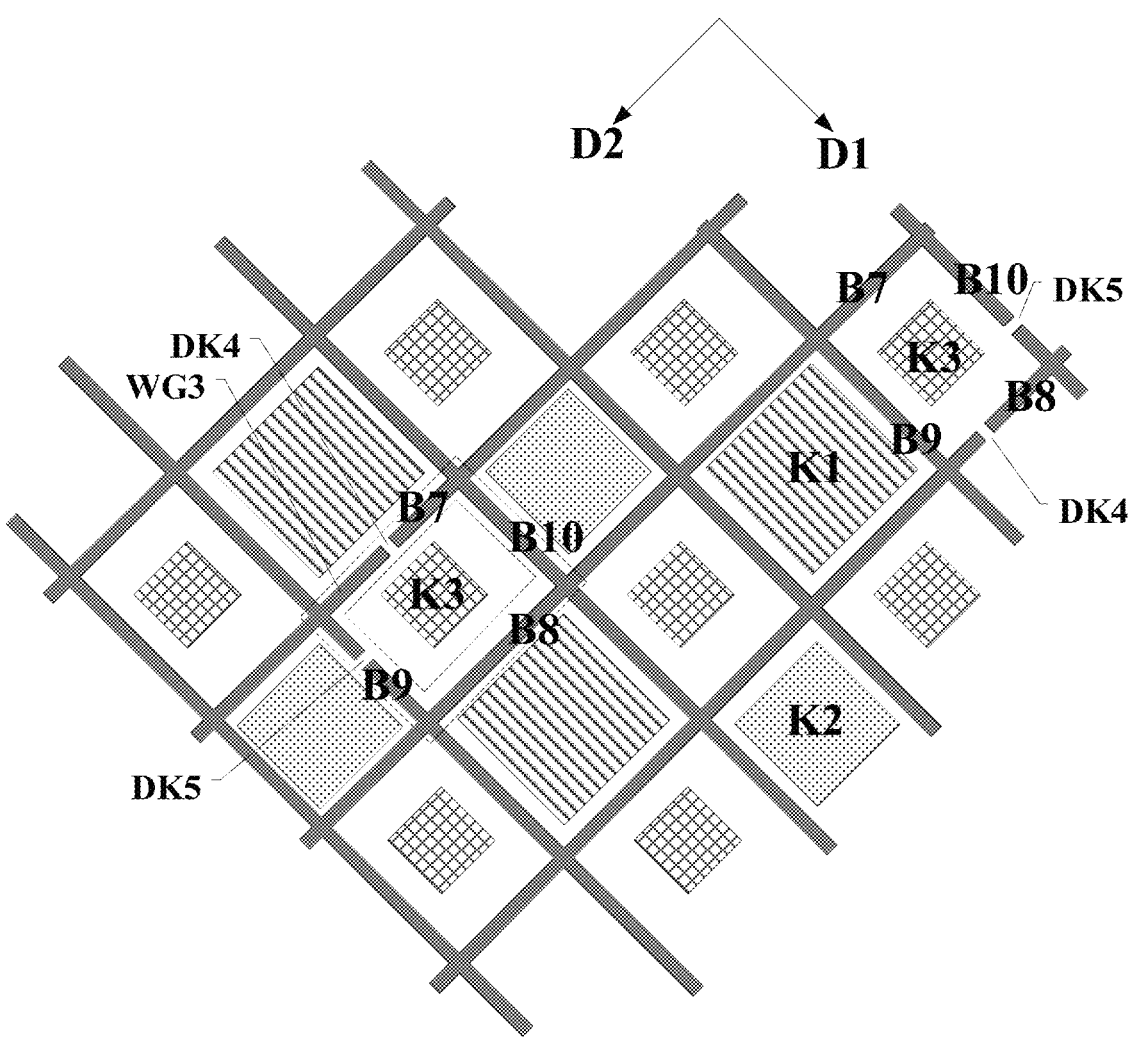
FIG. 21 is another schematic structural diagram of the fracture on the metal frame.

FIG. 21 is another schematic structural diagram of the fracture on the metal frame. Reference is made to FIG. 6 and FIG. 21, in one embodiment, the pixel opening K further comprises multiple third pixel openings K3. Light-emitting elements corresponding to the third pixel openings K3 are configured to emit light with a third color, and the third color is different from the first color. The metal frame comprises a third metal frame WG3. An orthographic projection of the third metal frame WG3 on the display panel corresponds to an orthographic projection of the third pixel opening K3 on the display panel. The third metal frame WG3 comprises a seventh bar B7 and the eighth bar B8 that are opposite to each other in the first direction D1, and a ninth bar B9 and a tenth bar B10 that are opposite to each other in the second direction D2. The fracture comprises a fourth fracture DK4 and a fifth fracture DK5. At least one fourth fracture DK4 is located on the seventh bar B7 of a third metal frame WG3, and a fifth fracture DK5 is located on the ninth bar B9 or the tenth bar B10 of the third metal frame WG3. At least one fourth fracture DK4 is located on the seventh bar B7 or the eighth bar B8 of another third metal frame, and a fifth fracture DK5 is located on the ninth bar B9 or the tenth bar B10 of the third metal frame WG3. The second direction D2 is parallel to the display panel and not parallel to the first direction D1.

Reference is made to FIG. 21, this embodiment shows a solution in which the display panel comprises the third pixel opening K3 and the corresponding third metal frame WG3. In an embodiment, the light-emitting element corresponding to the third pixel opening K3 is the green light-emitting element, the light-emitting element corresponding to the first pixel opening K1 is the blue light-emitting element, and the light-emitting element corresponding to the second pixel opening K2 is the red light-emitting element.

Reference is made to FIG. 6 and FIG. 21, a third metal frame WG3 is provided with two fractures, namely the fifth fracture DK5 and the fourth fracture DK4. The fifth fracture DK5 is located on the ninth bar B9 of the third metal frame WG3, and the fourth fracture DK4 is located on the seventh bar B7. Another third metal frame WG3 is also provided with two fractures, namely the fifth fracture DK5 and the fourth fracture DK4. The fifth fracture DK5 is located on the tenth bar B10 of the third metal frame WG3, and the fourth fracture is located on the eighth bar B8. In a same third metal frame WG3, the seventh bar B7 and the eighth bar B8 are opposite to each other in the first direction D1, and the ninth bar B9 and the tenth bar B10 are opposite to each other in the second direction D2. Thus, in a case that a part of the third metal frames WG3 is provided with two fractures, fifth fractures DK5 on two third metal frames WG3 are in pairs.

For a pair of fifth fractures DK5, the fifth fractures DK5 are respectively located on the ninth bars B9 or the tenth bars B10 of the two third metal frames WG3. In addition, fourth fractures DK4 are also in pairs. For a pair of fourth fractures DK4, the fourth fractures DK4 are respectively located on the seventh bars B7 or the eighth bars B8 of the two third metal frames WG3. Such arrangement of the fourth fractures DK4 and the fifth fractures DK5 on the third metal frames WG3 is conducive to reducing the display horizontal lines of the display panel at a large viewing angle.

Figure 22:
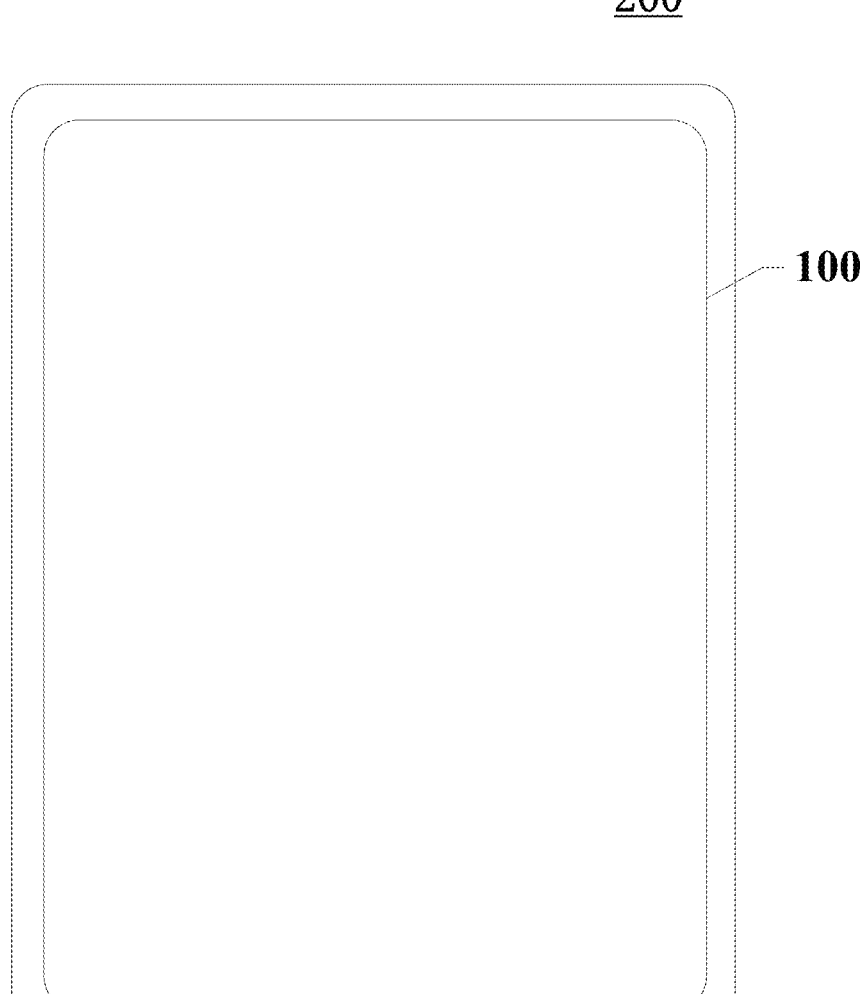
FIG. 22 is a top view of a display device according to an embodiment of the present disclosure.

Based on a same concept, a display device is further provided according to the present disclosure. FIG. 22 is a top view of the display panel according to an embodiment of the present disclosure. Reference is made to FIG. 22, the display device 200 comprises the display panel 100 according to the above embodiments of the present disclosure.

The display device herein may be a display device with a display function and a touch function, and a mobile phone, a tablet, a computer, a television, and a vehicle display device, which is not limited in the present disclosure. The display device according to the embodiments of the present disclosure has the beneficial effects of the display panel according to the embodiment of the present disclosure. The beneficial effects may refer to the description of the display panel in the above embodiments, which are not repeated.

The display panel and the display device according to the present disclosure have at least the following beneficial effects.

In the display panel and the display device herein, the touch layer is arranged on a side of the display layer, and the touch layer comprises multiple touch electrodes that are insulated from each other to realize the touch function of the display panel. The multiple touch electrodes comprise multiple metal frames that are electrically connected, and a fracture is provided between the adjacent touch electrodes to realize the insulation between the adjacent touch electrodes through the fracture. The display layer comprises multiple pixel openings and light-emitting elements corresponding to the pixel openings. The pixel opening herein comprises the first pixel opening. The light-emitting elements corresponding to the first pixel openings are configured to emit light with the same first color. The first metal frame corresponds to the first pixel opening. That is, the orthographic projection of the first metal frame on the display panel is located at the periphery of the orthographic projection of the first pixel opening on the display panel and surrounds the first pixel opening. The fracture formed on the first metal frame is the first fracture. The first metal frame comprises the first bar and the second bar that are opposite to each other in the first direction. At least one first fracture is located on the first bar of a first metal frame, and at least another first fracture is located on the first bar or the second bar of another first metal frame. With such setting, the first fracture on the first metal frame is located on the first bar or the second bar which are opposite to each other in the first direction, which is conducive to reducing the display horizontal lines at a large viewing angle, to improve the display effect of the display panel.

Although some embodiments of the present disclosure are described in detail through some examples, the above examples are only for illustration and not intended to limit the scope of the present disclosure. The above embodiments may be modified without departing from the scope and spirit of the present disclosure. The scope of the present disclosure is defined by the claims.

US 12,669,906 B2

19

20

The invention claimed is:

1. A display panel, comprising:

a display layer; and a touch layer, arranged on a side of the display layer, wherein:

the display layer comprises a plurality of pixel openings and light-emitting elements corresponding to the plurality of pixel openings, the plurality of pixel openings comprises a plurality of first pixel openings, and light-emitting elements corresponding to the plurality of first pixel openings are configured to emit light with a first color;

the touch layer comprises a plurality of touch electrodes that are insulated from each other, the plurality of touch electrodes comprises a plurality of metal frames that are electrically connected to form a grid and an orthographic projection of each metal frame of the plurality of metal frames on a plane where the display panel is located is located at a periphery of an orthographic projection of each pixel opening of the plurality of pixel openings on the plane where the display panel is located;

the plurality of metal frames comprises first metal frames, an orthographic projection of each first metal frame of the first metal frames on the plane where the display panel is located is located at the periphery of an orthographic projection of a respective first pixel opening of the plurality of first pixel openings on the plane where the display panel is located, and each first metal frame comprises a first bar and a second bar that are opposite to each other in a first direction; and one or more fractures are located between at least a pair of adjacent touch electrodes among the plurality of touch electrodes, the one or more fractures comprise first fractures, at least one of the first fractures is located in the first bar of a first metal frame of the first metal frames, and another at least one of the first fractures is located in the first bar or the second bar of another first metal frame of the first metal frames, wherein the first direction is parallel to the plane where the display panel is located, wherein the display panel further comprises a light blocking part, wherein the light blocking part overlaps at least partially with the one or more fractures when viewed along a direction perpendicular to the plane where the display panel is located, the touch layer comprises an electrode layer and a bridge layer, the bridge layer is arranged between the electrode layer and the display layer, the plurality of metal frames are arranged in the electrode layer, the bridge layer comprises a plurality of bridges, and at least a portion of the plurality of metal frames is electrically connected through the plurality of bridges; and the light blocking part is arranged in the bridge layer, and the light blocking part is insulated from the plurality of bridges.

2. The display panel according to claim 1, wherein the plurality of pixel openings comprises a plurality of second pixel openings, light-emitting elements corresponding to the plurality of second pixel openings are configured to emit light with a second color, and the second color is different from the first color;

the plurality of metal frames comprises second metal frames, an orthographic projection of each second metal frame of the second metal frames on the plane where the display panel is located is located at the periphery of an orthographic projection of a respective second pixel opening of the plurality of second pixel openings on the plane where the display panel is located, and each second metal frame comprises a third bar and a fourth bar that are opposite to each other in the first direction; and the one or more fractures comprise second fractures, at least one of the second fractures is located in the third bar of a second metal frame of the second metal frames, and another at least one of the second fractures is located in the third bar or the fourth bar of another second metal frame of the second metal frames.

3. The display panel according to claim 1, wherein the plurality of pixel openings comprises a plurality of second pixel openings, light-emitting elements corresponding to the plurality of second pixel openings are configured to emit light with a second color, and the second color is different from the first color;

the plurality of metal frames comprises second metal frames, an orthographic projection of each second metal frame of the second metal frames on the plane where the display panel is located is located at the periphery of an orthographic projection of a respective second pixel opening of the plurality of second pixel openings on the plane where the display panel is located, and each second metal frame comprises a fifth bar and a sixth bar that are opposite to each other in a second direction; and the one or more fractures comprise third fractures, at least one of the third fractures is located in the fifth bar of a second metal frame of the second metal frames, another at least one of the third fractures is located in the fifth bar or the sixth bar of another second metal frame of the second metal frames, wherein the second direction is parallel to the plane where the display panel is located and is not parallel to the first direction.

4. The display panel according to claim 1, wherein the light blocking part is arranged on a side of the touch layer away from the display layer.

5. The display panel according to claim 4, wherein the light blocking part is made of an insulating material, and at least the one or more fractures are filled with the light blocking part.

6. The display panel according to claim 4, wherein in the direction perpendicular to the plane where the display panel is located, the light blocking part is isolated from the one or more fractures through an insulating layer.

7. The display panel according to claim 1, wherein in the direction perpendicular to the plane where the display panel is located, a dimension of a gap between the light blocking part and the one or more fractures is greater than or equal to 0 and less than or equal to 3 μm.

8. The display panel according to claim 1, wherein in the fracture and the light blocking part corresponding to each other, an orthographic projection of the one or more fractures on the plane where the display panel is located is a first projection, an orthographic projection of the light blocking part on the plane where the display panel is located is a second projection, the first projection is located within the second projection, and a minimum distance between a contour of the first projection and a contour of the second projection is greater than or equal to 1 μm.

9. The display panel according to claim 1, wherein a touch electrode among the pair of adjacent touch electrodes comprises a first segment, another touch electrode among the pair of adjacent touch electrodes comprises a second segment, a first side surface of the first segment faces the second segment, a second side surface of the second segment faces the first segment, and at least a part of the one or more fractures is located between the first side surface and the second side surface; and an orthographic projection of the first side surface on the plane where the display panel is located is a first straight segment, an orthographic projection of the second side surface on the plane where the display panel is located is a second straight segment, and the first straight segment is parallel to the second straight segment.

10. The display panel according to claim 9, wherein in at least a part of the one or more fractures, an extension direction of the first straight segment is perpendicular to an extension direction of the first segment.

11. The display panel according to claim 9, wherein in at least a part of the one or more fractures, an extension direction of the first straight segment is not parallel to and not perpendicular to an extension direction of the first segment.

12. The display panel according to claim 9, wherein in a same fracture of the one or more fractures a minimum distance between the first straight segment and the second straight segment is less than or equal to 2.5 μm.

13. The display panel according to claim 1, wherein a touch electrode among the pair of adjacent touch electrodes comprises a first segment, another touch electrode among the pair of adjacent touch electrodes comprises a second segment, a first side surface of the first segment faces the second segment, a second side surface of the second segment faces the first segment, and at least a part of the one or more fractures is located between the first side surface and the second side surface; and an orthographic projection of the first side surface on the plane where the display panel is located comprises a first convex curve, an orthographic projection of the second side surface on the plane where the display panel is located comprises a first concave curve, and a shape of the first convex curve is conformed to a shape of the first concave curve.

14. The display panel according to claim 13, wherein a maximum width of a gap between the first side surface and the second side surface is less than or equal to 2.5 μm.

15. The display panel according to claim 1, wherein the plurality of pixel openings further comprises a plurality of third pixel openings, light-emitting elements corresponding to the plurality of third pixel openings are configured to emit light with a third color, and the third color is different from the first color;

the plurality of metal frames comprises third metal frames, an orthographic projection of each third metal frame of the third metal frames on the plane where the display panel is located is located at a periphery of an orthographic projection of a respective third pixel opening of the plurality of third pixel openings on the plane where the display panel is located, each third metal frame comprises a seventh bar and an eighth bar that are opposite to each other in the first direction, and a ninth bar and a tenth bar that are opposite to each other in a second direction, and the one or more fractures comprise fourth fractures and fifth fractures;

at least one of the fourth fractures is located in the seventh bar of a third metal frame of the third metal frames, and one of the fifth fractures is located in the ninth bar or the tenth bar of the third metal frame;

another at least one of the fourth fractures is located in the seventh bar or the eighth bar of another first metal frame of the first metal frames, and another one of the fifth fractures is located in the ninth bar or the tenth bar of the another third metal frame; and the second direction is parallel to the plane where the display panel is located, and the second direction is not parallel with the first direction.

16. The display panel according to claim 1, wherein the display layer comprises a pixel definition layer in which each pixel opening of the plurality of pixel openings is defined; and the display layer further comprises an anode layer and a cathode layer that are arranged on two sides, respectively, of the pixel definition layer in a direction perpendicular to the plane where the display panel is located, and a light-emitting material layer arranged between the anode layer and the cathode layer, wherein the light-emitting material layer is arranged at least in the plurality of pixel openings.

17. A display device, comprising a display panel, wherein the display panel comprises:

a display layer; and a touch layer, arranged on a side of the display layer, wherein:

the display layer comprises a plurality of pixel openings and light-emitting elements corresponding to the plurality of pixel openings, the plurality of pixel openings comprises a plurality of first pixel openings, and light-emitting elements corresponding to the plurality of first pixel openings are configured to emit light with a first color;

the touch layer comprises a plurality of touch electrodes that are insulated from each other, the plurality of touch electrodes comprises a plurality of metal frames that are electrically connected to form a grid and an orthographic projection of each metal frame of the plurality of metal frames on a plane where the display panel is located is located at a periphery of an orthographic projection of each pixel opening of the plurality of pixel openings on the plane where the display panel is located;

the plurality of metal frames comprises first metal frames, an orthographic projection of each first metal frame of the first metal frames on the plane where the display panel is located is located at the periphery of an orthographic projection of a respective first pixel opening of the plurality of first pixel openings on the plane where the display panel is located, and each first metal frame comprises a first bar and a second bar that are opposite to each other in a first direction; and one or more fractures are located between at least a pair of adjacent touch electrodes among the plurality of touch electrodes, the one or more fractures comprise first fractures, at least one of the first fractures is located in the first bar of a first metal frame of the first metal frames, and another at least one of the first fractures is located in the first bar or the second bar of another first metal frame of the first metal frames, wherein the first direction is parallel to the plane where the display panel is located, wherein the display panel further comprises a light blocking part, wherein the light blocking part overlaps at least partially with the one or more fractures when viewed along a direction perpendicular to the plane where the display panel is located, the touch layer comprises an electrode layer and a bridge layer, the bridge layer is arranged between the electrode layer and the display layer, the plurality of metal frames are arranged in the electrode layer, the bridge layer comprises a plurality of bridges, and at least a portion of the plurality of metal frames is electrically connected through the plurality of bridges; and the light blocking part is arranged in the bridge layer, and the light blocking part is insulated from the plurality of bridges.

* * * * *